United States Patent
Nishide et al.

(10) Patent No.: US 10,297,738 B2
(45) Date of Patent: *May 21, 2019

(54) THERMOELECTRIC CONVERSION MATERIAL COMPRISING A FULL-HEUSLER ALLOY AND METHOD FOR MANUFACTURING THE SAME BY ALLOYING AND SUCCESSIVELY HEATING A RAW MATERIAL

(71) Applicant: HITACHI METALS, LTD., Tokyo (JP)

(72) Inventors: Akinori Nishide, Tokyo (JP); Naoto Fukatani, Tokyo (JP); Jyun Hayakawa, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/564,932

(22) PCT Filed: Mar. 28, 2016

(86) PCT No.: PCT/JP2016/059943
§ 371 (c)(1),
(2) Date: Oct. 6, 2017

(87) PCT Pub. No.: WO2016/163262
PCT Pub. Date: Oct. 13, 2016

(65) Prior Publication Data
US 2018/0097167 A1 Apr. 5, 2018

(30) Foreign Application Priority Data

Apr. 8, 2015 (JP) .................................. 2015-079176

(51) Int. Cl.
*C30B 1/02* (2006.01)
*H01L 35/20* (2006.01)
(Continued)

(52) U.S. Cl.
CPC .............. *H01L 35/20* (2013.01); *B22F 3/105* (2013.01); *C22C 33/02* (2013.01); *C22C 38/00* (2013.01);
(Continued)

(58) Field of Classification Search
CPC .. C30B 1/00; C30B 1/02; C30B 1/023; C30B 1/04; C30B 1/10; C30B 1/12;
(Continued)

(56) References Cited

U.S. PATENT DOCUMENTS

2008/0236644 A1* 10/2008 Sakurada ................ C22C 30/00
136/239
2012/0032105 A1 2/2012 Seeler et al.
(Continued)

FOREIGN PATENT DOCUMENTS

JP 2008-021982 A 1/2008
JP 4035572 B * 1/2008
(Continued)

OTHER PUBLICATIONS

M. Mikami, et al. publication entitled "Synthesis and thermoelectric properties of microstructural Heusler Fe2VAl alloy," Journal of Alloys and Compounds, vol. 461, pp. 423-426 (2008). (Year: 2008).*
(Continued)

*Primary Examiner* — Kenneth A Bratland, Jr.
(74) *Attorney, Agent, or Firm* — Volpe and Koenig, P.C.

(57) ABSTRACT

The present invention provides a metal-based thermoelectric conversion material having a high figure-of-merit ZT, the thermoelectric conversion material being a p-type or n-type
(Continued)

full-Heusler alloy, having a composition of an Fe2TiA type (wherein A is Si and/or Sn), and including crystal grains having an average grain diameter of 30-500 nm. In particular, in the case where the composition of an Fe2TiA type is represented by the empirical formula $Fe_{2+\sigma}Ti_{1+y}A_{1+z}$, the values of σ, y, and z in an Fe—Ti-A ternary alloy phase diagram lie within the range α surrounded by the points (50, 37, 13), (45, 30, 25), (39.5, 25, 35.5), (50, 14, 36), (54, 21, 25), and (55.5, 25, 19.5) in terms of (Fe, Ti, A) in at %.

14 Claims, 20 Drawing Sheets

(51) Int. Cl.
| | |
|---|---|
| *C22C 33/02* | (2006.01) |
| *C22C 38/00* | (2006.01) |
| *H02N 11/00* | (2006.01) |
| *B22F 3/105* | (2006.01) |
| *H01L 35/30* | (2006.01) |
| *H01L 35/32* | (2006.01) |
| *H01L 35/34* | (2006.01) |

(52) U.S. Cl.
CPC ............. *H01L 35/30* (2013.01); *H01L 35/32* (2013.01); *H01L 35/34* (2013.01); *H02N 11/00* (2013.01)

(58) Field of Classification Search
CPC ......... C30B 29/00; C30B 29/10; C30B 29/52; C30B 33/00; C30B 33/02; H01L 35/20; H01L 35/30; H01L 35/32; H01L 35/34; B22F 3/105; C22C 33/02; C22C 38/00; H02N 11/00
USPC ................................. 117/3–4, 6–9, 937, 939
See application file for complete search history.

(56) References Cited

U.S. PATENT DOCUMENTS

| | | | | |
|---|---|---|---|---|
| 2014/0345663 | A1* | 11/2014 | Hayakawa | H01L 35/14 136/205 |
| 2015/0136195 | A1* | 5/2015 | Nishide | C22C 38/00 136/239 |

FOREIGN PATENT DOCUMENTS

| | | |
|---|---|---|
| JP | 2010-226034 A | 10/2010 |
| JP | 2015-005653 A | 1/2015 |
| WO | 2013/093967 A1 | 6/2013 |
| WO | WO-2013093967 A1 * | 6/2013 ............. H01L 35/14 |
| WO | 2013/175571 A1 | 11/2013 |

OTHER PUBLICATIONS

Mikami, M., et al., "Synthesis and thermoelectric properties of microstructural Heusler Fe2 VAl alloy," Journal of Alloys and Compounds, vol. 461, Issues 1-2, Aug. 11, 2008, pp. 423-426.
Mikami, M., et al., "The Effect of Bi Addition on Thermoelectric Properties of the Sintered Heusler Fe2 Val Alloy," Materials Research Society, Symposium Proceedings, vol. 1044, 2008 Materials Research Society, 1044-U06-09, pp. 229-234.
International Search Report, PCT/JP2016/059943, dated Jun. 14, 2016, 2 pgs.
Japanese Office Action dated Jul. 17, 2018 for the Japanese Patent Application No. 2017-510937.

* cited by examiner (a)

(b)

THERMOELECTRIC CONVERSION MATERIAL COMPRISING A FULL-HEUSLER ALLOY AND METHOD FOR MANUFACTURING THE SAME BY ALLOYING AND SUCCESSIVELY HEATING A RAW MATERIAL

TECHNICAL FIELD

The present invention relates to a thermoelectric conversion material and a process for producing the material.

BACKGROUND ART

In recent years, international concern over the reduction of $CO_2$ that is thought to be a substance causing a global warming phenomenon increases and technological innovation for shifting used energy from resource energy that emits $CO_2$ in large quantities toward next-generation energy such as natural energy and reused thermal energy advances. As the candidates of next-generation energy technologies, technologies using natural energy such as sunlight and wind power and technologies reusing losses of primary energy such as emitted heat and vibrations caused by the use of resource energy are conceivable.

Whereas traditional resource energy is centralized energy generated mainly in massive power generation facilities, next-generation energy has the feature of being unevenly distributed in both the cases of natural energy and reused energy. In today's energy usage, energy emitted without being utilized accounts for about 60% of primary energy and the main feature is exhaust heat. Further, exhaust heat of not higher than 200° C. accounts for as much as 70% of the exhaust heat. Consequently, not only the proportion of next-generation energy in primary energy is required to increase but also technologies of reusing energy, in particular the technologies of converting the energy of exhaust heat of not higher than 200° C. into electric power, are required to improve.

When the energy of exhaust heat is intended to be used, a power generation system having a high versatility with respect to an installation mode is required because the exhaust heat is generated at various situations. As a strong candidate technology, a thermoelectric conversion technology is named.

The major part of a thermoelectric conversion technology is a thermoelectric conversion module. The thermoelectric conversion module is arranged in proximity to a heat source and generates electricity by generating temperature difference in the module. The thermoelectric conversion module takes a structure of alternately aligning an n-type thermoelectric conversion material to generate an electromotive force from a high-temperature side toward a low-temperature side along a temperature gradient and a p-type thermoelectric conversion material generating an electromotive force in the direction opposite to the n-type.

The maximum output P of a thermoelectric conversion module is determined by the product of the flow rate of the heat flowing in the module and a conversion efficiency 11 of a thermoelectric conversion material. A heat flow rate depends on a module structure suitable for a thermoelectric conversion material. Further, a conversion efficiency η depends on a figure-of-merit ZT, which is non-dimensional, of a thermoelectric conversion material. A figure-of-merit ZT is represented by $ZT=\{S^2/(\kappa\rho)\}T$ (here, S: Seebeck coefficient, ρ: electric resistivity, κ: thermal conductivity, T: temperature). In order to improve the maximum output P of a thermoelectric conversion module therefore, it is desirable to increase a Seebeck coefficient S and decrease an electric resistivity p and a thermal conductivity κ in a thermoelectric conversion material.

Meanwhile, thermoelectric conversion materials are roughly classified into a metal-based thermoelectric conversion material, a compound (semiconductor)-based thermoelectric conversion material, and an oxide-based thermoelectric conversion material. Among those thermoelectric conversion materials, as representative thermoelectric conversion materials having temperature characteristics applicable to exhaust heat recovery at not higher than 200° C., an $Fe_2VAl$ type full-Heusler alloy and a Bi—Te type semiconductor are named. An $Fe_2VAl$ type full-Heusler alloy is a metal-based thermoelectric conversion material and a Bi—Te type semiconductor is a compound-based thermoelectric conversion material. Thermoelectric conversion materials of those two types themselves can be structural materials and hence are suitable for thermoelectric conversion modules for exhaust heat recovery in a power plant, a factory, and an automobile. Problems of a Bi—Te type semiconductor however are that Te is highly toxic and the cost is high. In application for the above-mentioned exhaust heat recovery therefore, a full-Heusler alloy of a metal base such as an $Fe_2VAl$ type is more suitable than a Bi—Te type semiconductor.

With a conventional full-Heusler alloy however, the figure-of-merit ZT is only about 0.1 in the form of a bulk material that is a practical form. In exhaust heat recovery of a practically used level, a material having a figure-of-merit ZT not less than 0.1 is required.

The main reason why the figure-of-merit ZT of a full-Heusler alloy is low is that the thermal conductivity is high. As the reasons why the thermal conductivity of a full-Heusler alloy is high, named are (i) heat transfers well through the medium of electrons because the electric resistivity is low and (ii) heat transfers well through lattice vibration because the mean free path of phonons is long.

With regard to the reduction of the heat transfer derived from electrons in (i), intentional modulation is not desirable because it derives from an electronic state determining the thermoelectric conversion characteristic of a full-Heusler alloy. In contrast, with regard to the reduction of a thermal conductivity derived from lattice vibration in (ii), it can be attained by controlling the organizational structure of an alloy. It is known that a thermal conductivity can be reduced particularly by decreasing the average grain size of crystal grains in an alloy.

For example, Non-patent Literature 1 describes that grain sizes are fractionized up to about 200 nm by pulverizing and mixing a bulk material of an $Fe_2VAl$ type full-Heusler alloy with a ball mill in order to reduce a thermal conductivity and the thermal conductivity reduces to 10 W/km.

Further, Non-patent Literature 2 discloses a thermoelectric conversion material comprising an $Fe_2VAl$ type full-Heusler alloy. According to the described production conditions, the average grain size of crystal grains (hereunder referred to merely as a crystal grain size occasionally) is smaller than 200 nm in the thermoelectric conversion material.

Furthermore, Patent Literature 1 discloses a thermoelectric conversion material comprising an $Fe_2(TiV)(AlSi)$ type having a crystal structure of a full-Heusler alloy.

CITATION LIST

Patent Literature

PTL 1: WO 2013/093967

Non-patent Literature

NPTL 1: Journal of Alloys and Compounds, Volume 461, Issues 1-2, 11 Aug. 2008, Pages 423-426
NPTL 2: Mater. Res. Symp. Proc. Vol. 1044 (2008 Material Research Society), 1044-U06-09, Mikami et al., the Effect of Bi Addition on thermoelectric Properties of the Sintered Heusler Fe2VAl

SUMMARY OF INVENTION

Technical Problem

It is desirable to reduce a thermal conductivity κ as stated above in order to improve a figure-of-merit ZT and to reduce the crystal grain size of an alloy is known as a means for the reduction. The figure-of-merit ZT of a conventional thermoelectric conversion material such as an $Fe_2VAl$ type full-Heusler alloy or the like in Non-patent Literature 2 however is less than 0.12. The reason, which will be described in detail later, is that, in a conventional metal-based thermoelectric conversion material, even though a crystal grain size is reduced and a thermal conductivity κ is reduced, a Seebeck coefficient S tends to lower and an electric resistivity ρ tends to increase. As a result, a figure-of-merit ZT remains at a similar level or rather decreases.

In order to increase a figure-of-merit ZT therefore, in addition to reducing a thermal conductivity κ by fractionizing a crystal grain size, it is necessary to find a possible condition of: inhibiting a Seebeck coefficient S from lowering; inhibiting an electric resistivity ρ from increasing; or taking both the measures.

An object of the present invention is to provide a thermoelectric conversion material of a metal-based full-Heusler type having a high figure-of-merit ZT and a process for producing the material.

Solution to Problem

The present invention is a thermoelectric conversion material comprising a full-Heusler alloy having a p-type or an n-type wherein: the full-Heusler alloy has a composition of an $Fe_2TiA$ (here, A is at least one element selected from Si and Sn) type; and the average grain size of crystal grains is not less than 30 nm to not more than 500 nm.

The average crystal grain size of the full-Heusler alloy is desirably not less than 35 nm to not more than 200 nm and more desirably not less than 40 nm to not more than 150 nm.

Further, the full-Heusler alloy desirably: has the $Fe_2TiA$ type composition represented by a composition formula $Fe_{2+\sigma}Ti_{1+y}A_{1+z}$; and has values of σ, y, and z allowing the full-Heusler alloy to fall within a region α surrounded by points (50, 37, 13), (45, 30, 25), (39.5, 25, 35.5), (50, 14, 36), (54, 21, 25), and (55.5, 25, 19.5) in terms of (Fe, Ti, A) in at % in an Fe—Ti-A ternary alloy phase diagram.

Furthermore, the full-Heusler alloy represented by the composition formula $Fe_{2+\sigma}Ti_{1+y}A_{1+z}$ desirably has values of σ, y, and z allowing the full-Heusler alloy to fall within a region β surrounded by points (50, 35, 15), (47.5, 27.5, 25), (40, 25, 35), (50, 17, 33), (52.2, 22.8, 25) and (52.8, 25, 22.2) in terms of (Fe, Ti, A) in at % in an Fe—Ti-A ternary alloy phase diagram.

Moreover, the full-Heusler alloy represented by the composition formula $Fe_{2+\sigma}Ti_{1+y}A_{1+z}$ desirably has values of σ, y, and z allowing the full-Heusler alloy to fall within a region γ surrounded by points (50, 32.6, 17.4), (49.2, 25.8, 25), (43.9, 25, 31.1), (50, 23, 27), (51, 24, 25), and (51, 25, 24) in terms of (Fe, Ti, A) in at % in an Fe—Ti-A ternary alloy phase diagram.

Adoptable is a material wherein:
the full-Heusler alloy represented by the composition formula $Fe_{2+\sigma}Ti_{1+y}A_{1+z}$ is modulated compositionally from a stoichiometric composition by substituting elements M and N for Ti and A respectively and is represented by a composition formula $Fe_{2+\sigma}(Ti_{1-x}M_x)_{1+y}(A_{1-w}N_w)_{1+z}$; and, on this occasion, a VEC is represented by a function of σ, x, y, w, and z, being expressed by VEC(σ, x, y, w, z)=[8X(2+σ)+{4X(1-x)+(valence electron number of M)Xx}X(1+y)+{4X(1-w)+(valence electron number of N)Xw}X(1+z)]/4, σ={of Fe in any one of the regions σ, γ, and β)−50}/25,
y={(at % of Ti in any one of the regions α γ, and β)−25}/25,
z={(at % of A in any one of the regions α, γ, and β)−25}/25,
and has values of x and w satisfying an expression 0<|ΔVEC|≤0.2 when a variation ΔVEC of the VEC is represented by ΔVEC=VEC (σ, x, y, w, z)−VEC (σ, 0, y, 0, z).

Each of the elements M and N can be at least any one of Cu, Nb, V, Al, Ta, Cr, Mo, W, Hf, Ge, Ga, In, P, B, Bi, and Zr.

The element M can be V and a substitution quantity x can satisfy an expression |x|≤0.25.

In addition, the present invention is a process for producing a full-Heusler alloy having a p-type or an n-type, the process comprising the steps of: preparing a raw material having a composition of an $Fe_2TiA$ (here, A is at least one element selected from Si and Sn) type; alloying the raw material to form an amorphous alloy; and successively heating the alloy so that the average grain size of crystal grains may be not less than 30 nm to not more than 500 nm.

Advantageous Effects of Invention

The present invention makes it possible to provide a thermoelectric conversion material that: is a full-Heusler alloy having a composition of an $Fe_2TiA$ (here, A is at least one element selected from Si and Sn) type; and has a figure-of-merit ZT larger than a conventional metal-based full-Heusler alloy by controlling the crystal grain sizes to not less than 30 nm to not more than 500 nm.

DESCRIPTION OF EMBODIMENTS

<Principle of Improving Conversion Performance>

Figure 1:
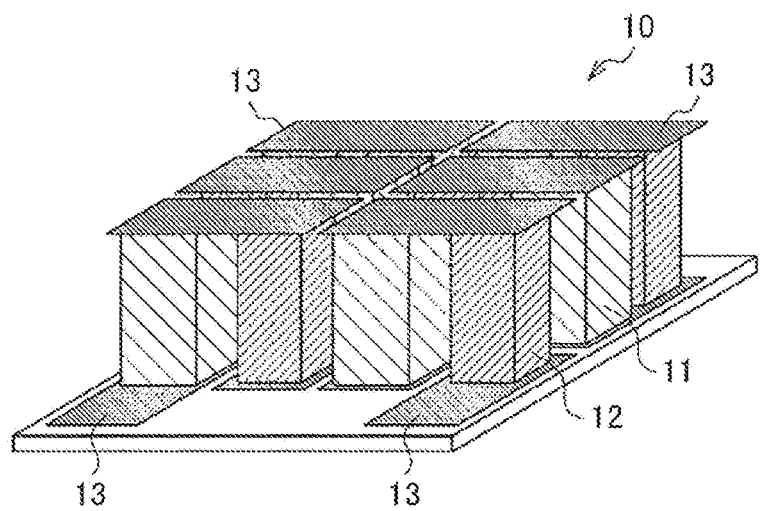
FIG. 1 shows schematic diagrams of a thermoelectric conversion module using a thermoelectric conversion material according to an embodiment of the present invention: (a) shows a state before an upper substrate is attached and (b) shows a state after an upper substrate is attached.
Figure 1:
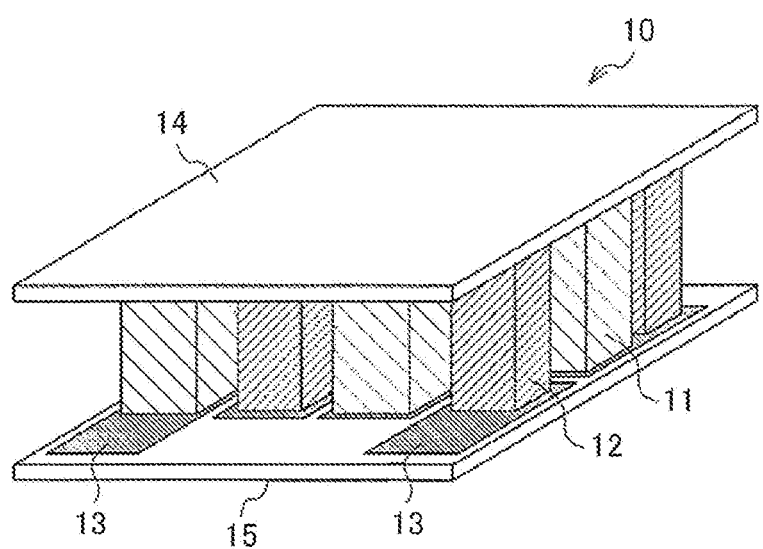

Firstly, a principle of improving conversion performance of a thermoelectric conversion material comprising a full-Heusler alloy is explained. A full-Heusler alloy comprising an $X_2YZ$ type alloy has an electronic state, a so-called pseudo gap. In order to explain how such a pseudo gap relates to thermoelectric conversion performance, a general relationship between thermoelectric conversion performance and an electronic state is explained.

A figure-of-merit ZT is given by the following Num 1 as stated earlier. Here, S represents a Seebeck coefficient, ρ an electric resistivity, κ a thermal conductivity, and T a temperature.

[Num 1]

$$ZT = \frac{S^2}{\kappa\rho}T \tag{1}$$

A figure-of-merit increases as a Seebeck coefficient S increases or an electric resistivity ρ and a thermal conductivity κ decrease. A Seebeck coefficient S and an electric resistivity ρ are physical quantities determined by the electronic state of a material. A Seebeck coefficient S has a relationship represented by the following Num 2.

[Num 2]

$$S \propto \frac{1}{N(E_F)}\left(\frac{\partial N(E)}{\partial E}\right)_{E \sim E_F} \tag{2}$$

E: binding energy, N: state density

According to Num 2, a Seebeck coefficient S is: inversely proportional to the absolute value of a state density (density of states) N in a Fermi level; and proportional to an energy gradient of the state density N. It is understood therefore that a material that has a small state density in a Fermi level and allows a state density to rise rapidly has a high Seebeck coefficient S.

Meanwhile, an electric resistivity ρ has a relationship represented by the following Num 3.

[Num 3]

$$\frac{1}{\rho} \propto \lambda_F v_F N(E_F) \qquad (3)$$

$\lambda_F$: mean free path of electrons in a Fermi level, $v_F$: velocity of electrons in a Fermi level According to Num 3, an electric resistivity ρ is inversely proportional to a state density N and hence an electric resistivity ρ decreases when a Fermi level is located at an energy position where the absolute value of a state density N is large.

Meanwhile, a thermal conductivity κ can be regarded as the sum of a lattice thermal conductivity κp of transferring heat through lattice vibration and an electron thermal conductivity κe of transferring heat with electrons acting as a medium. An electron thermal conductivity κe: increases as an electric resistivity p decreases by the Wiedemann-Franz law; and depends on a pseudo gap electronic state. An electron thermal conductivity κe can be decreased by controlling a carrier density and generally, when a carrier density is smaller than $10^{20}/cm^3$, an electron thermal conductivity κe comes to be minimum and the proportion of a lattice thermal conductivity κp in the whole thermal conductivity κ increases. An electric resistivity ρ however increases at the same time as a carrier density decreases. Consequently, a figure-of-merit ZT is estimated to be maximum at a certain carrier density by balance between the increase of an electric resistivity ρ and the decrease of a thermal conductivity κ responding to the decrease of a carrier density. Meanwhile, a lattice thermal conductivity κp depends on the size of a lattice. Summarizing the above, a thermal conductivity κ is represented by the following numerical expression (Num 4).

[Num 4]

$$\kappa = k_f \times C_p \times \zeta \qquad (4)$$

$C_p$: specimen constant pressure specific heat, ζ: density of material

Here, $C_p$ is a constant pressure specific heat of a thermoelectric conversion material and ζ is a density of a thermoelectric conversion material. Further, a constant $k_f$ is represented by the following numerical expression (Num 5).

[Num 5]

$$k_f = \frac{d^2}{\tau_f} \qquad (5)$$

Here, d is an average grain size of crystal grains in a thermoelectric conversion material and $\tau_f$ is a time spent when heat is transferred from the rear surface to the front surface of a crystal grain in a thermoelectric conversion material.

As shown by the above numerical expressions (Num 4) and (Num 5), the thermal conductivity κ of a thermoelectric conversion material decreases as the average grain size of crystal grains in the thermoelectric conversion material decreases. In a thermoelectric conversion material comprising a full-Heusler alloy in this way, it is known that a figure-of-merit ZT can be increased by decreasing the average grain size of crystal grains.

Figure 13:
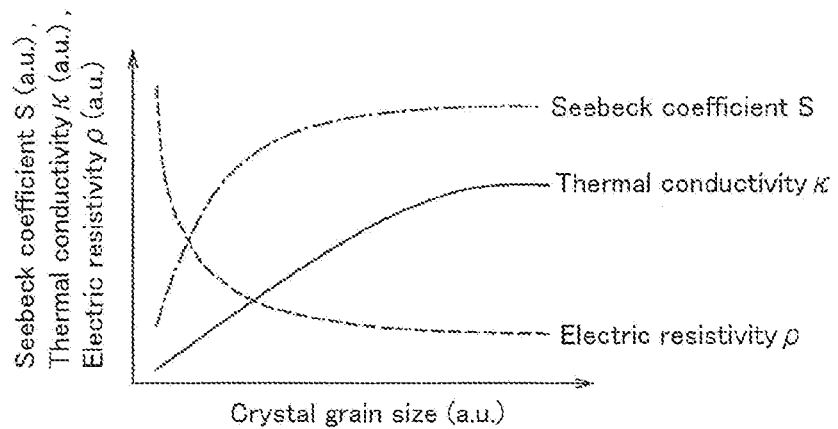
FIG. 13 is a schematic diagram for explaining relationships among a crystal grain size, S: Seebeck coefficient, ρ: electric resistivity, and κ: thermal conductivity in $Fe_2VAl$.
Figure 14:
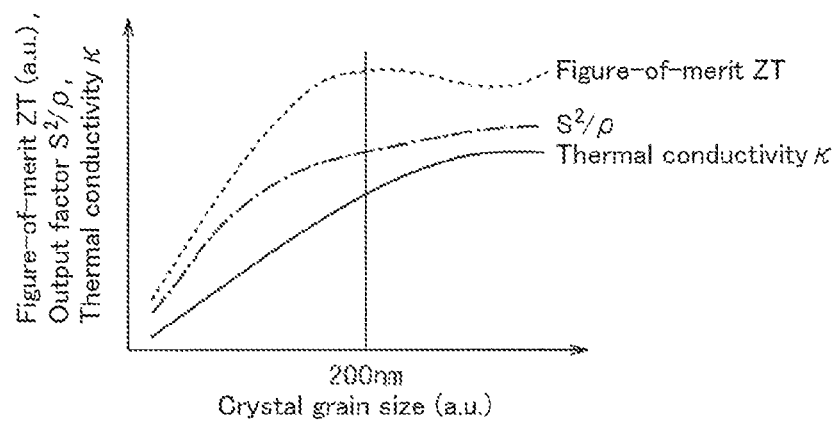
FIG. 14 is a graph showing relationships of a figure-of-merit, an output factor, and a thermal conductivity with a crystal grain size.

In a thermoelectric conversion material of $Fe_2VAl$ that has heretofore been studied as a full-Heusler alloy in Non-patent Literature 2 or the like however, an electric resistivity ρ increases undesirably when a thermal conductivity κ is decreased by decreasing a crystal grain size as shown in FIG. 13. As a result, $S^2/\rho$ (hereunder referred to as an output factor) in a figure-of-merit $ZT = \{S^2/(\kappa\rho)\}T$ decreases undesirably as shown in FIG. 14. In a thermoelectric conversion material of an $Fe_2VAl$ type therefore, a figure-of-merit ZT has not so much increased as expected even when a crystal grain size is decreased to about 200 nm for example.

In view of the above situation, the present inventors have adopted a composition of an $Fe_2TiA$ (here, A is at least one element selected from Si and Sn) type as a full-Heusler alloy. It has been found that, in a full-Heusler alloy of this type, the increase of an electric resistivity ρ is minor and also the lowering of a Seebeck coefficient is inhibited unlike a conventional metal-based full-Heusler alloy even when a crystal grain size is set at not less than 30 nm to not more than 500 nm and a thermal conductivity κ is decreased. Consequently, a thermoelectric conversion material having a large figure-of-merit ZT can be obtained. Further, such an $Fe_2TiA$ type alloy has a high Seebeck coefficient S in both a p-type and an n-type.

When a crystal grain size is not less than 30 nm, a figure-of-merit ZT can improve more than a conventional material of $Fe_2VAl$ or the like. When a crystal grain size is less than 30 nm, a figure-of-merit ZT is smaller than a conventional material of $Fe_2VAl$ or the like. When a crystal grain size exceeds 500 nm in contrast, likewise a figure-of-merit ZT is smaller than a conventional material of $Fe_2VAl$ or the like. For the reason, the lower limit of an average crystal grain size is set at 30 nm and the upper limit of an average crystal grain size is set at 500 nm in the present invention.

A more desirable range is not less than 35 nm to not more than 200 nm and a yet more desirable range is not less than 40 nm to not more than 150 nm.

A thermoelectric conversion material having minute crystal grain sizes can be produced by heat-treating an amorphized $Fe_2TiA$ type alloy for example in order to control the crystal grain sizes to not more than 500 nm. A composition of an $L2_1$ structure can be obtained more easily by heat-treating a once-amorphized alloy.

As a means for producing an amorphized $Fe_2TiA$ type raw material, mechanical alloying, a method of ultrarapidly cooling a raw material after melted, or the like can be adopted. When an amorphized material is not powdery, a means of pulverizing the material under an environment of preventing hydrogen embrittlement and oxidation may be adopted.

Here, an amorphous material texture is not limited to complete amorphousness and may also be an amorphous state having a long-range order or a short-range order. Further, amorphous powder formed by mixing fine powder and coarse powder may also be acceptable.

In heat treatment for minutely crystallizing an amorphized raw material, the crystal grain size of an obtained material increases as a temperature rises and a retention time increases. A crystal grain size can be controlled by appropriately setting a temperature and a retention time. When an $Fe_2TiA$ type alloy is used for example, a temperature is preferably not lower than 550° C. to not higher than 700° C.

in terms of retention temperature. Further, a retention time is preferably not less than 0.05 hour to not more than 10 hours.

Heat treatment and sintering may also be applied simultaneously. Specifically, a method of containing amorphized alloy powder into a carbon die or a tungsten carbide die and sintering the alloy powder while a pulsed electric current is applied under a pressure of 40 MPa to 5 GPa in an inert gas atmosphere can be adopted. As a temperature condition, it is desirable to: raise a temperature to a temperature of not lower than 550° C. to not higher than 700° C.; retain a powder alloy for not less than 0.05 hour to not more than 3 hours at a highest temperature; and successively cool the alloy to room temperature.

Molding and sintering of a raw material are explained.

As molding, a known means such as pressure molding can be adopted.

Sintering can be applied in a magnetic field and a magnetic-field-oriented sintered body can be obtained. Otherwise, pressure molding and sintering can be applied simultaneously. As such a means, discharge plasma sintering can be used.

A thermoelectric conversion material of an $Fe_2TiA$ type may be a typical stoichiometric composition of 2:1:1 in terms of Fe:Ti:A. Otherwise, even a composition range deviating from a stoichiometric composition in a predetermined range is also allowable. Such an allowable predetermined range is explained hereunder.

Figure 2A:
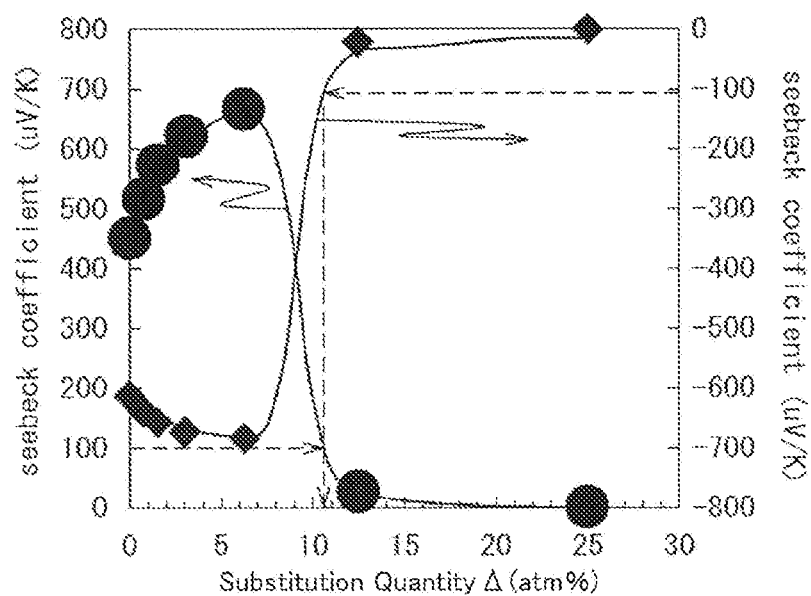
FIG. 2A shows variations of Seebeck coefficients responding to modulation quantities (substitution by increasing Si and decreasing Fe) in compositions modulated from a stoichiometric composition.
Figure 2B:
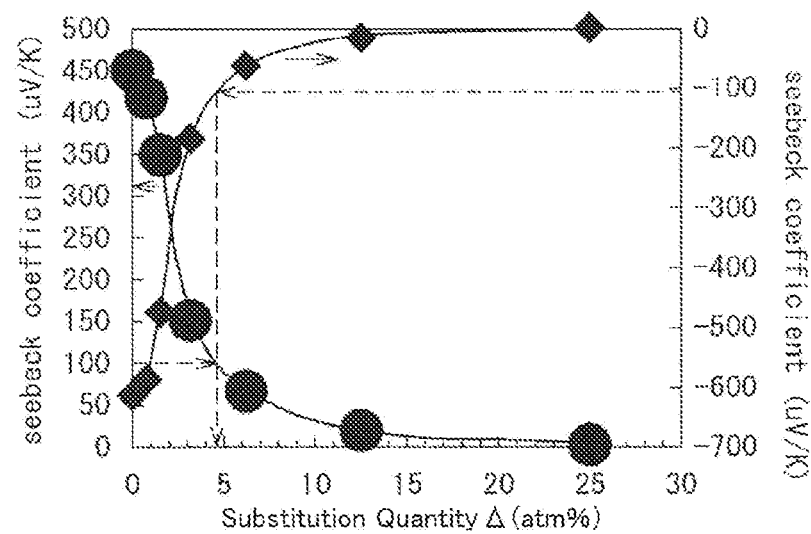
FIG. 2B shows variations of Seebeck coefficients responding to modulation quantities (substitution by increasing Ti and decreasing Fe) in compositions modulated from a stoichiometric composition.
Figure 2C:
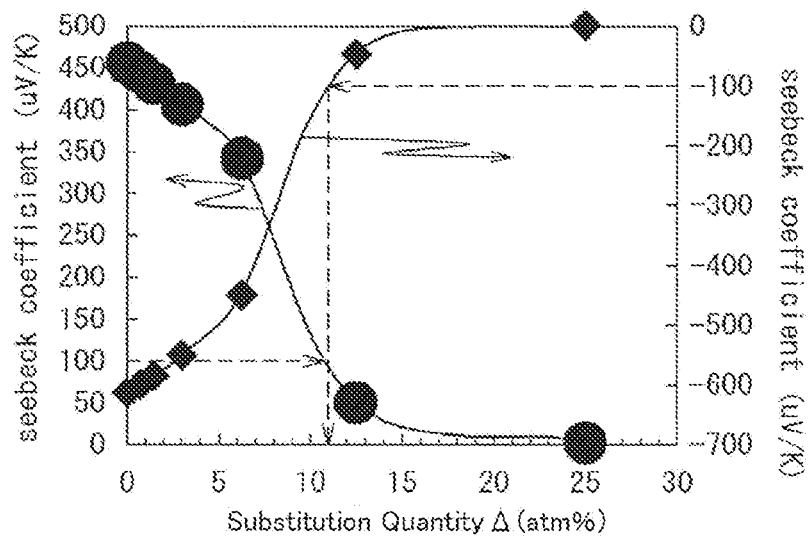
FIG. 2C shows variations of Seebeck coefficients responding to modulation quantities (substitution by increasing Si and decreasing Ti) in compositions modulated from a stoichiometric composition.
Figure 2D:
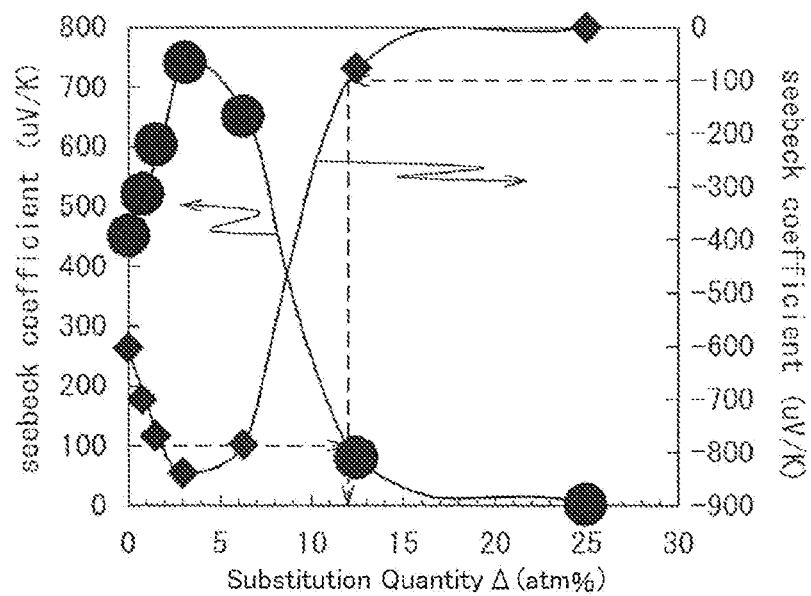
FIG. 2D shows variations of Seebeck coefficients responding to modulation quantities (substitution by increasing Ti and decreasing Si) in compositions modulated from a stoichiometric composition.
Figure 2E:
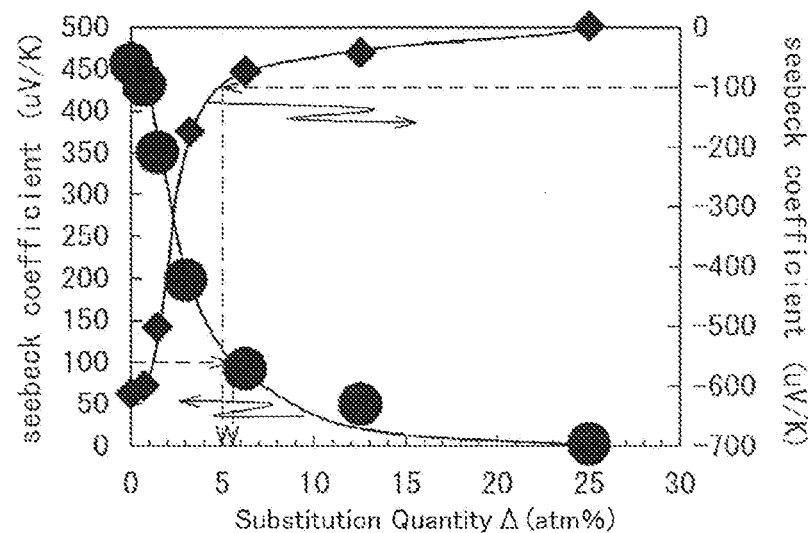
FIG. 2E shows variations of Seebeck coefficients responding to modulation quantities (substitution by increasing Fe and decreasing Si) in compositions modulated from a stoichiometric composition.
Figure 2F:
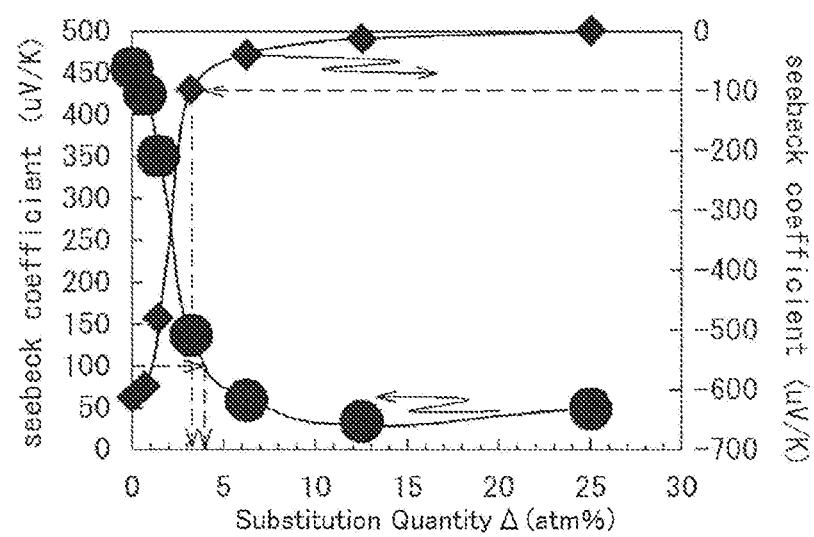
FIG. 2F shows variations of Seebeck coefficients responding to modulation quantities (substitution by increasing Fe and decreasing Ti) in compositions modulated from a stoichiometric composition.

Variations of Seebeck coefficients responding to the extent modulated from a stoichiometric composition to a nonstoichiometric composition in an FeTiA(Si) type Heusler alloy are plotted in FIGS. 2A to 2F. FIG. 2A shows the variations of Seebeck coefficients obtained when Ti stays in a stoichiometric composition, Si increases, and Fe decreases; FIG. 2B shows the variations of Seebeck coefficients obtained when Si stays in a stoichiometric composition, Ti increases, and Fe decreases; FIG. 2C shows the variations of Seebeck coefficients obtained when Fe stays in a stoichiometric composition, Ti decreases, and Si increases; FIG. 2D shows the variations of Seebeck coefficients obtained when Fe stays in a stoichiometric composition, Ti increases, and Si decreases; FIG. 2E shows the variations of Seebeck coefficients obtained when Ti stays in a stoichiometric composition, Fe increases, and Si decreases; and FIG. 2F shows the variations of Seebeck coefficients obtained when Si stays in a stoichiometric composition, Fe increases, and Ti decreases. Here, with regard to the vertical axes in each of FIGS. 2A to 2F, Seebeck coefficients in the case of a p-type are shown on the left side (shown by ●) and Seebeck coefficients in the case of an n-type are shown on the right side (shown by ◆). Those calculation results are the results of obtaining electronic states and then Seebeck coefficients in the compositions obtained by substituting an element one by one in $4(Fe_2Ti_1Si_1)$, $8(Fe_4Ti_2Si_2)$, $16(Fe_8Ti_4Si_4)$, $64(Fe_{32}Ti_{16}Si_{16})$, and $128(Fe_{64}Ti_{32}Si_{32})$ atomic systems similarly to the calculation results of a 32 $(Fe_{16}Ti_8Si_8)$ atomic system. An atomic ratio per one atom varies in proportion to the total number of atoms and hence a substitution quantity can be described by at %. In the cases of 4 and 8 atomic systems (substitution quantities Δ are 12.5 at % and 25 at %), the substitution of one atom changes the symmetry of a crystal system largely. In a 4 atomic system for example, when Fe and Ti are exchanged in $Fe_2TiSi$, $Fe_2TiSi$ changes into $Fe_3Si$ or $FeTi_2Si$ and the crystal system changes now into another crystal system. That means that an electronic state deviates largely from the electronic state shown in (b) of FIG. 3 and hence the absolute value of a Seebeck coefficient drops conspicuously. In the case of an 8 atomic system likewise, an atomic arrangement that is likely to create a metallic electronic state is undesirably caused in a unit cell by the considerable change of the symmetry of a crystal structure and the absolute value of a Seebeck coefficient decreases.

In this way, an allowable substitution quantity for obtaining a practical-level Seebeck coefficient is, in each of substitution methods: 10.8 at % (the position of the broken line in FIG. 2A) in both the cases of a p-type and an n-type when Ti stays in a stoichiometric composition, Si increases, and Fe decreases; 4.9 at % (the position of the broken line in FIG. 2B) in both the cases of a p-type and an n-type when Si stays in a stoichiometric composition, Ti increases, and Fe decreases; 11 at % (the position of the broken line in FIG. 2C) in both the cases of a p-type and an n-type when Fe stays in a stoichiometric composition, Ti decreases, and Si increases; 12.0 at % (the position of the broken line in FIG. 2D) in both the cases of a p-type and an n-type when Fe stays in a stoichiometric composition, Ti increases, and Si decreases; 5.9 at % in the case of a p-type and 5 at % in the case of an n-type (the positions of the broken lines in FIG. 2E) when Ti stays in a stoichiometric composition, Fe increases, and Si decreases; and 4.0 at % in the case of a p-type and 3.2 at % in the case of an n-type (the positions of the broken lines in FIG. 2F) when Si stays in a stoichiometric composition, Fe increases, and Ti decreases.

Figure 5:
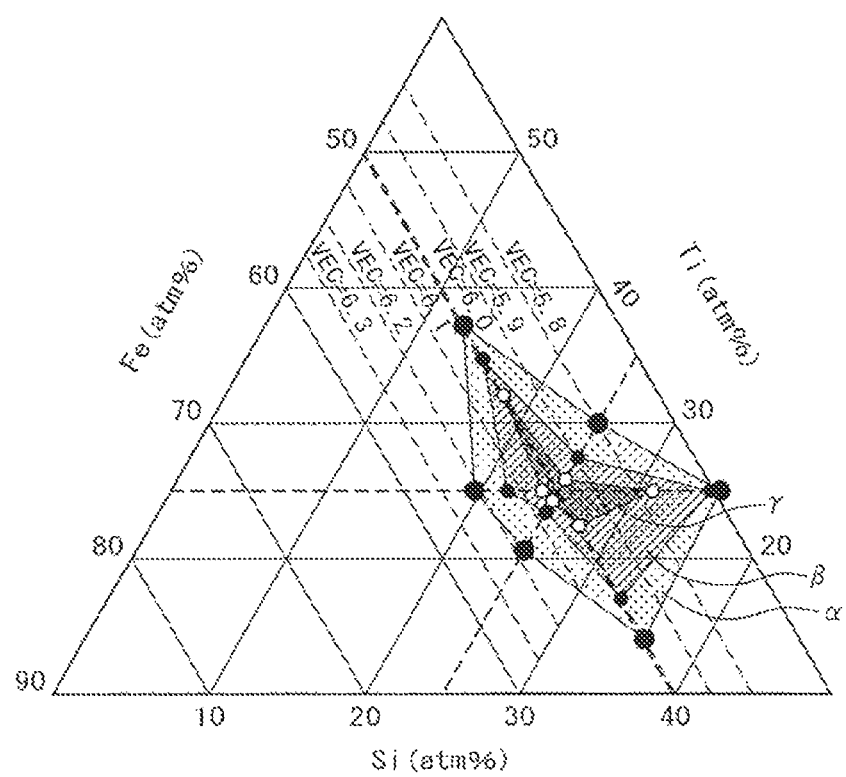
FIG. 5 is a ternary alloy phase diagram of an Fe—Ti—Si type full-Heusler alloy and shows ranges where the improvement effect of a Seebeck coefficient is estimated to be high by numerical calculation.

A result showing an appropriate composition range obtained from such substitution quantities on a ternary alloy phase diagram is FIG. 5. The region α surrounded by the large black circles showing; 12.0 at % when Fe stays in a stoichiometric composition, Ti increases, and Si decreases; 11 at % when Fe stays in a stoichiometric composition, Ti decreases, and Si increases; 4.9 at % when Si stays in a stoichiometric composition, Ti increases, and Fe decreases; 10.8 at % when Ti stays in a stoichiometric composition, Si increases, and Fe decreases; 4.0 at % when Si stays in a stoichiometric composition, Fe increases, and Ti decreases; and 5.9 at % when Ti stays in a stoichiometric composition, Fe increases, and Si decreases on a ternary alloy phase diagram can be said to be an appropriate range. The region is expressed in terms of at % as follows: (Fe, Ti, A)=(50, 37, 13), (45, 30, 25), (39.5, 25, 35.5), (50, 14, 36), (54, 21, 25), (55.5, 25, 19.5).

Further, a characteristic is particularly good in the region β surrounded by the straight lines connecting the points (50, 35, 15), (47.5, 27.5, 25), (40, 25, 35), (50, 17, 33), (52.2, 22.8, 25) and (52.8, 25, 22.2) in terms of (Fe, Ti, A) in at % shown by the 6 small black circles on a ternary alloy phase diagram. Furthermore, a region having a characteristic better than a stoichiometric composition is the region γ that is shown by the white circles and surrounded by the straight lines connecting the following 6 points (50, 32.6, 17.4), (49.2, 25.8, 25), (43.9, 25, 31.1), (50, 23, 27), (51, 24, 25), and (51, 25, 24) in terms of (Fe, Ti, A).

According to the relationship between an Si increment and a Seebeck coefficient described in FIG. 2A in particular, a Seebeck coefficient is better when Fe is intentionally decreased (Si is intentionally increased) than a Seebeck coefficient of a stoichiometric composition (substitution quantity Δ=0 at %). Specifically, a composition of decreasing Fe by 1 at % to 9 at % (increasing Si by 1 at % to 9 at %) from a stoichiometric composition is desirable. The decrement of Fe, when it is expressed by an Fe quantity (2+σ) in a composition formula $Fe_{2+\sigma}Ti_{1+y}A_{1+z}$, corresponds to a numerical value σ satisfying the expression $-0.36 \leq \sigma \leq -0.04$. That is, by adjusting a composition so that a numerical value σ may be in the range of $-0.36 \leq \sigma \leq -0.04$ rather than a stoichiometric composition of σ=y=z=0, a thermoelectric conversion material having an improved Seebeck coefficient is obtained. σ is more desirably in the range of $-0.32 \leq \sigma \leq -0.08$.

Further, according to the relationship between a Ti increment and a Seebeck coefficient described in FIG. 2D, a Seebeck coefficient is better when Ti is intentionally increased than a Seebeck coefficient of a stoichiometric composition. Specifically, a composition of increasing Ti by 1 at % to 8 at % from a stoichiometric composition is desirable. The increment of Ti, when it is expressed by a Ti quantity (1+y) in a composition formula $Fe_{2+\sigma}Ti_{1+y}A_{1+z}$, corresponds to the numerical value y satisfying the expression $0.04 \leq y \leq 0.32$. That is, by adjusting a composition so that a numerical value y may be in the range of $0.04 \leq y \leq 0.32$ rather than a stoichiometric composition of σ=y=z=0, a thermoelectric conversion material having an improved Seebeck coefficient is obtained. y is more desirably in the range of $0.08 \leq y \leq 0.28$.

V can be substituted for Ti of not more than 25 at %. A figure-of-merit ZT can be better than an $Fe_2TiA$ alloy not containing V.

A composition formed by substituting V in the range of more than 0 at % to not more than 5.0 at % for at least one of Ti in the aforementioned composition formula when the whole composition is regarded as 100 at % is acceptable. Otherwise, a composition of containing Cu in the range of not less than 0.5 at % to not more than 1.6 at % is acceptable. Here, a composition containing Cu described here is not a composition of an $L2_1$ structure of a thermoelectric conversion material but indicates an average composition in a whole composition including a precipitate segregating at a grain boundary.

A thermoelectric conversion characteristic can be enhanced further by adopting a composition of substituting V or a composition of containing Cu.

On this occasion, a crystal grain size of a full-Heusler alloy is desirably not less than 30 nm to not more than 140 nm.

Further, by substituting such an appropriate substituent element as stated above and controlling the number of valence electrons per atom (Valence Electron Concentration, hereunder referred to as VEC) when an Fe—Ti-A type Heusler alloy is synthesized at respective composition ratios, a thermoelectric conversion material showing a high performance is obtained. The details are explained hereunder.

Firstly, the reason why an $Fe_2TiA$ type alloy used in the present invention has a high Seebeck coefficient S is explained.

A distinctive band structure called a flat band exists in a pseudo gap structure deciding the thermoelectric conversion characteristic of a full-Heusler alloy and is one of the factors deciding the thermoelectric conversion characteristic.

That is, a state density in the vicinity of a Fermi level Ef can be changed steeply as a flat band comes close to the vicinity of the Fermi level. As a result, a thermoelectric conversion characteristic, particularly a Seebeck coefficient S, improves. Further, since the gap value of a pseudo gap can be controlled to a small value, an advantage that an electric resistivity does not increase is obtained.

Figure 3:
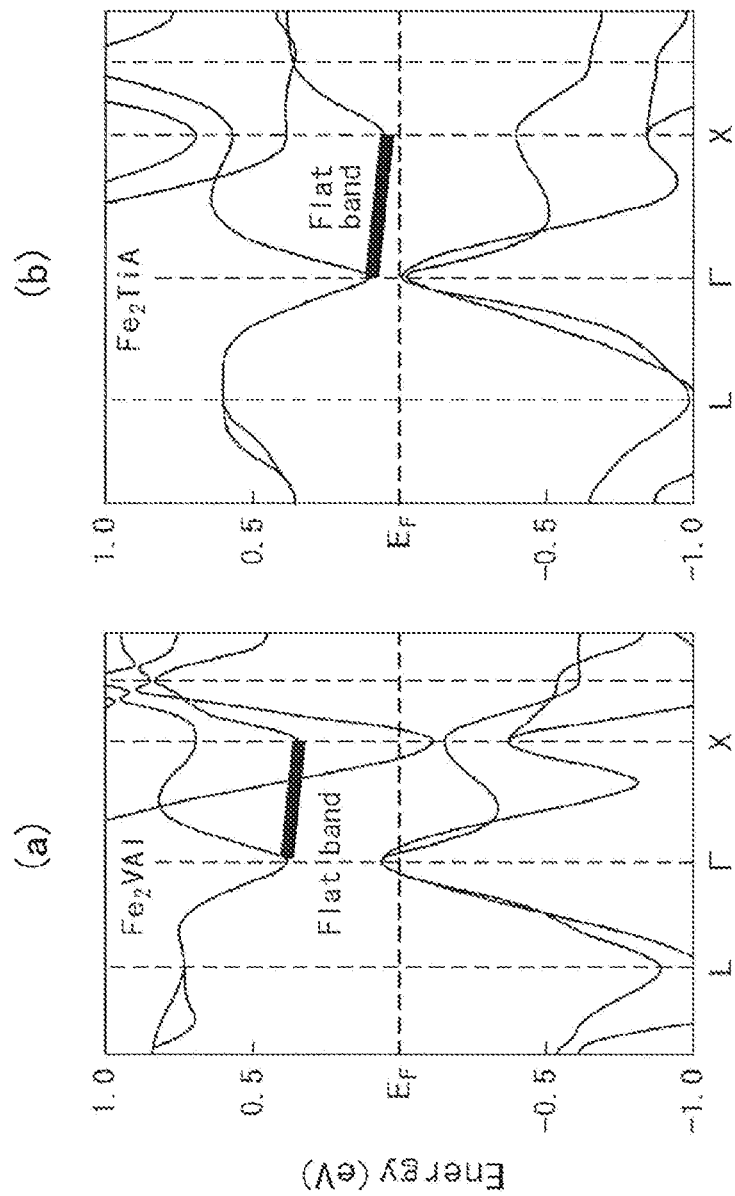
FIG. 3 represents graphs showing the results of electronic states of full-Heusler alloys obtained through first principles calculation: (a) is the case of an $Fe_2VAl$ alloy and (b) is the case of an $Fe_2TiSi$ alloy or an $Fe_2TiSn$ alloy.
Figure 4A:
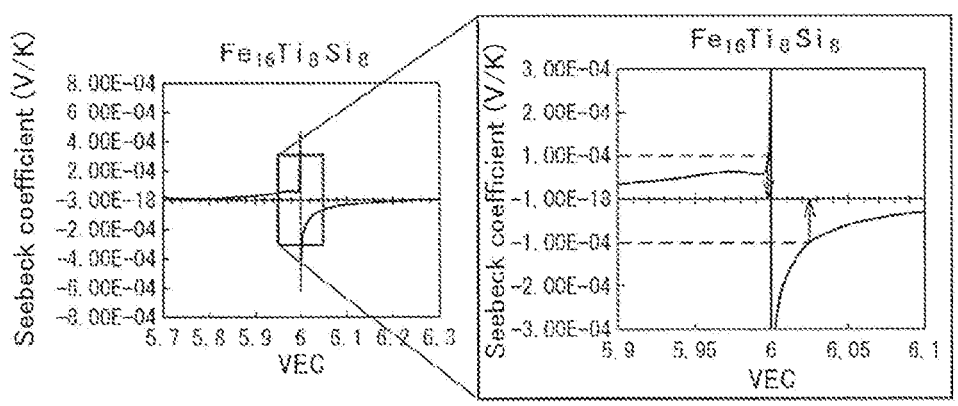
FIG. 4A shows VEC dependency (calculated values) of a Seebeck coefficient estimated from the band structure of an $Fe_{16}Ti_8Si_8$ alloy.
Figure 4B:
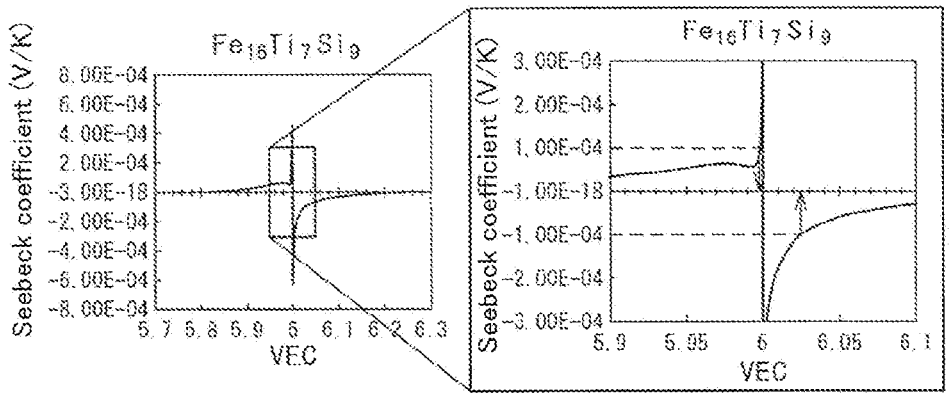
FIG. 4B shows VEC dependency (calculated values) of a Seebeck coefficient estimated from the band structure of an $Fe_{16}Ti_7Si_9$ alloy.
Figure 4C:
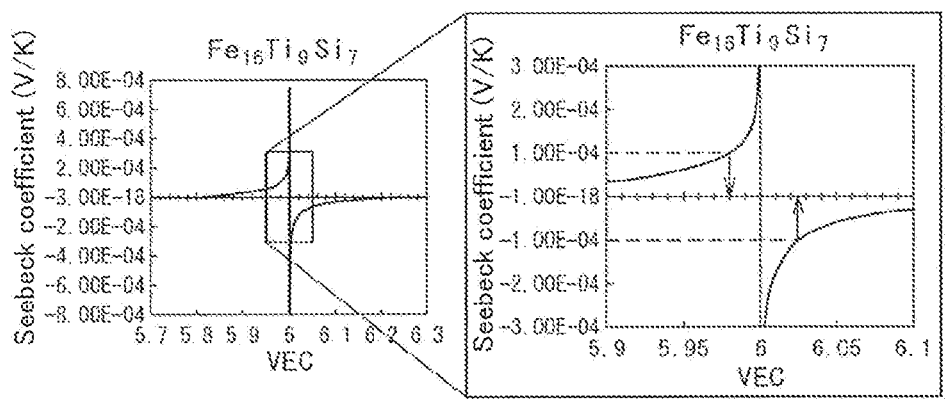
FIG. 4C shows VEC dependency (calculated values) of a Seebeck coefficient estimated from the band structure of an $Fe_{16}Ti_9Si_7$ alloy.
Figure 4D:
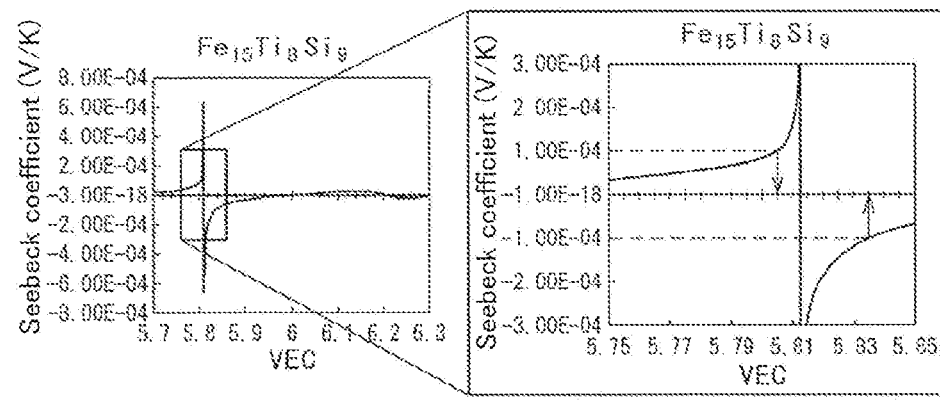
FIG. 4D shows VEC dependency (calculated values) of a Seebeck coefficient estimated from the band structure of an $Fe_{15}Ti_8Si_9$ alloy.
Figure 4E:
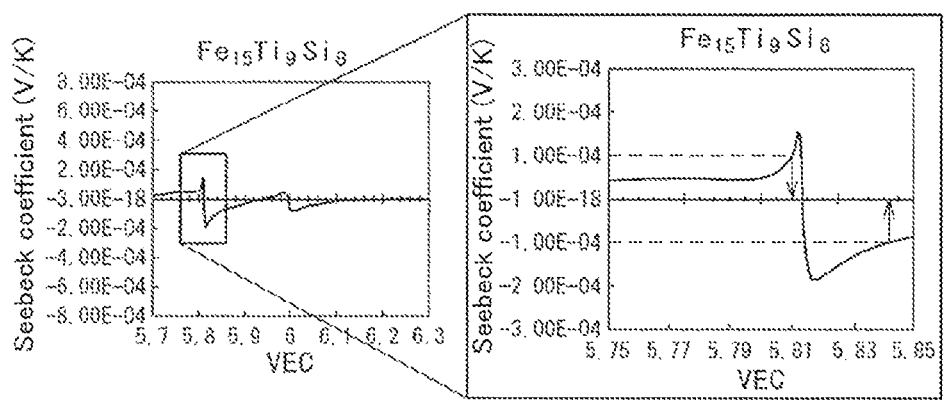
FIG. 4E shows VEC dependency (calculated values) of a Seebeck coefficient estimated from the band structure of an $Fe_{15}Ti_9Si_8$ alloy.
Figure 4F:
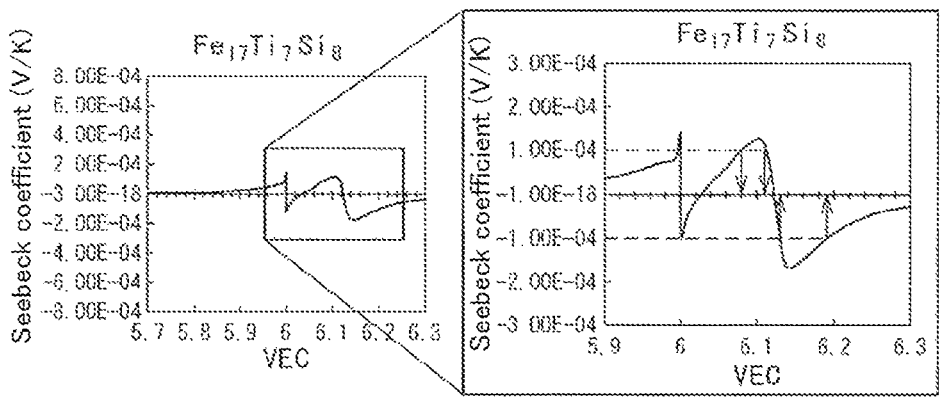
FIG. 4F shows VEC dependency (calculated values) of a Seebeck coefficient estimated from the band structure of an $Fe_{17}Ti_7Si_8$ alloy.
Figure 4G:
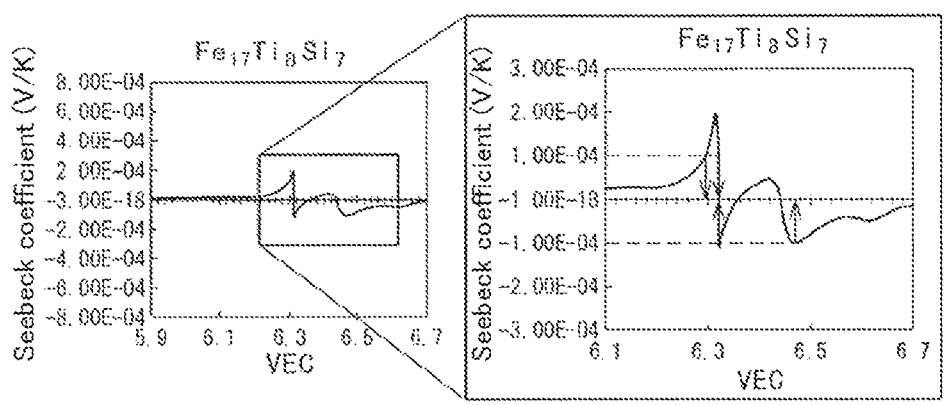
FIG. 4G shows VEC dependency (calculated values) of a Seebeck coefficient estimated from the band structure of an $Fe_{17}Ti_8Si_7$ alloy.

(a) and (b) of FIG. 3 are graphs showing the results of electronic states of full-Heusler alloys obtained by first principles calculation. (a) of FIG. 3 shows the electronic state of $Fe_2VAl$ and (b) of FIG. 3 shows the electronic state of an $Fe_2TiA$ alloy that is a full-Heusler alloy according to an embodiment of the present invention.

As shown in (a) and (b) of FIG. 3, it is obvious that a flat band is closer to the vicinity of a Fermi level $E_f$ in the case of an $Fe_2TiA$ alloy than in the case of an $Fe_2VAl$ alloy.

An $X_2YZ$ type alloy behaves like a rigid band model, which means that, even when the composition ratio of a chemical compound changes, a band structure does not change largely but the energy position of a Fermi level changes. As a result, an $X_2YZ$ type alloy has the nature of being likely to control a Fermi level at such an energy position as to: change a state density steeply; optimize the absolute value of the state density; and improve thermoelectric conversion performance. A Fermi level can be controlled by VEC control of doping electrons or holes and specifically the VEC control can be carried out by changing the composition ratio of a chemical compound, the content of a substituent element, or the like.

Here, a VEC is defined by a value obtained by dividing a total valence electron number (number of valence electrons) Z in a chemical compound by an atom number (number of atoms) a in a unit cell.

For example, in the case of $Fe_2TiSi$, the valence electron number of iron (Fe) is 8, the valence electron number of titanium (Ti) is 4, and the valence electron number of silicon (Si) is 4. Further, in the case of $Fe_2TiSi$, the atom number of iron (Fe) in a unit cell is 2, the atom number of titanium (Ti) in a unit cell is 1, and the atom number of silicon (Si) in a unit cell is 1. Consequently, the total valence electron number Z in $Fe_2TiSi$ is calculated as $Z=8\times2+4\times1+4\times1=24$, the atom number a in the unit cell is calculated as $a=2+1+1$, and the valence electron number per one atom VEC is calculated as $VEC=Z/a=6$.

When the composition ratio of a chemical compound changes, the value of a VEC increases or decreases. It is known that the increase and decrease of a VEC are approximately equivalent to electron doping and hole doping in a rigid band model and the value and the polarity of a Seebeck coefficient S can be changed by the control of a VEC.

Specifically, a case where a VEC is less than 6 can be regarded as hole doping and hence a p-type thermoelectric conversion material is obtained. On the other hand, when a VEC is not less than 6, an n-type thermoelectric conversion material is obtained. Further, from a preceding example of continuously changing a VEC in the vicinity of 6, it is already known that Seebeck coefficients take maximum values in the vicinities of the VEC respectively in the cases of a p-type and an n-type.

Calculated values of Seebeck coefficients S of $Fe_2TiA$ type alloys estimated from band structures are shown in FIGS. 4A to 4G. Each of FIGS. 4A to 4G shows dependency of a Seebeck coefficient on a VEC calculated through first principles calculation.

Specifically, on the basis of a 32 atomic system, an electronic state is calculated in each composition obtained by substituting an atom for another atom one by one in a stoichiometric composition $Fe_{16}Ti_8Si_8$. FIGS. 4B to 4G show the calculation results of electronic states in FIG. 4B: $Fe_{16}Ti_7Si_9$, 4C: $Fe_{16}Ti_9Si_7$, 4D: $Fe_{15}Ti_8Si_9$, 4E: $Fe_{15}Ti_9Si_8$, 4F: $Fe_{17}Ti_7Si_8$, and 4G: $Fe_{17}Ti_8Si_7$.

Here, FIGS. 4A to 4G show calculation results obtained by using Si as A but similar calculation results are obtained even when Sn is used in place of Si. Further, similar calculation results are obtained even when SiSn is used in place of Si.

It is obvious that, in an $Fe_2TiA$ type alloy, a Seebeck coefficient takes peaks on the negative side and the positive side of a VEC(=6) respectively, and the negative side of the VEC can be used as a p-type thermoelectric conversion material and the positive side can be used as an n-type thermoelectric conversion material. Calculated values of a Seebeck coefficient S are S=+400 uV/K (maximum value of the Seebeck coefficient on the left side in FIG. 4A) in the case of a p-type and S=−600 uV/K (minimum value of the Seebeck coefficient on the left side in FIG. 4A) in the case of an n-type, and the performance improves to a level not less than triple of a conventional $Fe_2VAl$ type full-Heusler alloy. The increase of a Seebeck coefficient S corresponds to a ninefold improvement of a figure-of-merit ZT.

A range where the absolute value of a Seebeck coefficient S exceeds 100 uV/K that allows a practicable ZT to be obtained has a certain range in the variation of a VEC (hereunder referred to as ΔVEC) from the center value of the VEC. ΔVEC can be changed by substituting another element for Ti or A.

A relationship between an appropriate ΔVEC and a substitution quantity of a substituent element is shown below.

A full-Heusler alloy represented by the composition formula $Fe_{2+\sigma}Ti_{1+y}A_{1+z}$ stated earlier is modulated compositionally from a stoichiometric composition by substituting elements M and N for Ti and A respectively and is represented by a composition formula $Fe_{2+\sigma}(Ti_{1-x}M_x)_{1+y}(A_{1-w}N_w)_{1+z}$, and, on this occasion, a VEC is represented by a function of σ, x, y, w, and z, being expressed by VEC (σ, x, y, w, z)=[8X(2+σ)+{4X(1−x)+(valence electron number of M)Xx}X(1+y)+{4X(1−w)+(valence electron number of N)Xw}X(1+z)]/4, α={of Fe in a region (any one of α, β, and γ) in FIG. 5)−50}/25, y={of Ti in a region (any one of α, β, and γ) in FIG. 5)−25}/25, z={(at % of A in a region (any one of α, β, and γ) in FIG. 5)−25}/25, and a variation ΔVEC of a VEC is represented by ΔVEC=VEC (σ, x, y, w, z)−VEC (σ, 0, y, 0, z).

A Seebeck coefficient takes a maximum value when at least any one of Cu, Nb, V, Al, Ta, Cr, Mo, W, Hf, Ge, Ga, In, P, B, Bi, and Zr is substituted as each of the elements M and N in each of a p-type and an n-type so that the absolute value of a ΔVEC may fall in the range of more than 0 to not more than 0.2 (0<|ΔVEC|≤0.2). Here, the center value of a VEC in each mother alloy composition means a VEC value obtained when x and w take 0 and 0 respectively. A VEC is in a desirable range when an expression 0<|ΔVEC|≤0.2 is satisfied. In order to control a VEC in a desired range, a combination of the alloy contents x and w and the substituent elements M and N may be selected so that the expression 0<|ΔVEC|≤0.2 may be satisfied by substituting at least any one of Cu, Nb, V, Al, Ta, Cr, Mo, W, Hf, Ge, Ga, In, P, B, Bi, and Zr. In particular, an excellent effect is recognized by substituting V (vanadium) for a part of Ti and a desirable substitution quantity x is in the range of |x|≤0.25.

Here, at least any one of Cu, Nb, V, Al, Ta, Cr, Mo, W, Hf, Ge, Ga, In, P, B, Bi, and Zr can be used as each of the elements M and N in order to adjust the total quantity of electrons. A characteristic similar to (b) of FIG. 3 can be obtained even in the case of the substitution. It is desirable to select V as the element M and satisfy the expression |x|≤0.25.

A thermoelectric conversion material according to the present invention can be mounted over a thermoelectric conversion module 10 shown in FIG. 1 for example. In the thermoelectric conversion module 10, a thermoelectric conversion material according to the present invention can be used in a p-type thermoelectric conversion unit 11 and an n-type thermoelectric conversion unit 12. In a p-type thermoelectric conversion unit 11 however, a thermoelectric conversion material having another composition such as $Fe_2NbAl$ or $FeS_2$ can also be used. As a material for an upper substrate 14 and a lower substrate 15, GaN, silicon nitride, or the like can be used. As a material for an electrode 13, Cu, Au, or the like can be used.

EXAMPLE 1

A thermoelectric conversion material according to the present invention is produced by the following method.

Fe, Ti, V, and Si are used as materials and V is substituted for a part of Ti and the raw materials are weighed so as to have an $Fe_2TiSi$ type composition in Table 1.

The raw materials are contained in an SUS container and mixed with SUS balls 10 mm in diameter in an inert gas atmosphere. Successively, mechanical alloying is applied for 20 hours or longer in a planetary ball mill while the condition of orbital speed is varied in the range of 200 rpm to 500 rpm and amorphized alloy powder is obtained. The amorphized alloy powder is contained in a carbon die or a tungsten carbide die and sintered under the pressures of 40 MPa to 5 GPa in an inert gas atmosphere while pulsed current is applied. With regard to the temperature condition, the temperature is raised to 550° C. to 700° C. and retained at the highest temperature for 3 to 180 minutes. Successively, the sintered material is cooled to room temperature and a thermoelectric conversion material shown in Table 1 is obtained.

The crystal grain size of an obtained thermoelectric conversion material is evaluated with a transmission electron microscope (TEM) and an X-ray diffractometer (XRD). Further, a thermal conductivity κ is calculated by measuring a thermal diffusivity by a laser flash method and measuring a specific heat by differential scanning calorimetry (DSC). Furthermore, an electric resistivity ρ and a Seebeck coefficient S are measured with a Seebeck coefficient/electric resistance measurement system (ZEM) made by ULVAC RIKO, Inc.

Obtained measurement results are shown in Table 1. Table 1 shows the measurement results of Examples 1-2 to 1-7 and Comparative Examples 1-1 and 1-8.

TABLE 1

| No. | Fe (at %) | Ti (at %) | V (at %) | Si (at %) | Crystal grain size (nm) | S (uV/K) | ρ (uΩm) | k (W/Km) | ZT |
|---|---|---|---|---|---|---|---|---|---|
| *1-1 | bal | 21.4 | 2.4 | 26.7 | 21.7 | −20.4 | 21.9 | 3.56 | 0.0017 |
| 1-2 | bal | 21.4 | 2.4 | 26.7 | 39.3 | −87.6 | 12.2 | 1.71 | 0.12 |
| 1-3 | bal | 21.4 | 2.4 | 26.7 | 64.3 | −113 8 | 10.8 | 0.94 | 0.41 |
| 1-4 | bal | 21.4 | 2.4 | 26.7 | 94.1 | −119.3 | 11.2 | 1.13 | 0.36 |
| 1-5 | bal | 21.4 | 2.4 | 26.7 | 109.4 | −120.6 | 11.6 | 1.23 | 0.32 |
| 1-6 | bal | 21.4 | 2.4 | 26.7 | 115.7 | −122.0 | 10.8 | 1.2 | 0.37 |

TABLE 1-continued

| No. | Fe (at %) | Ti (at %) | V (at %) | Si (at %) | Crystal grain size (nm) | S (uV/K) | ρ (uΩm) | k (W/Km) | ZT |
|---|---|---|---|---|---|---|---|---|---|
| 1-7 | bal | 21.4 | 2.4 | 26.7 | 130.6 | −120.3 | 10.2 | 1.55 | 0.3 |
| *1-8 | bal | 21.4 | 2.4 | 26.7 | 1000 | −70.5 | 6.74 | 10.2 | 0.0026 |

Figure 10:
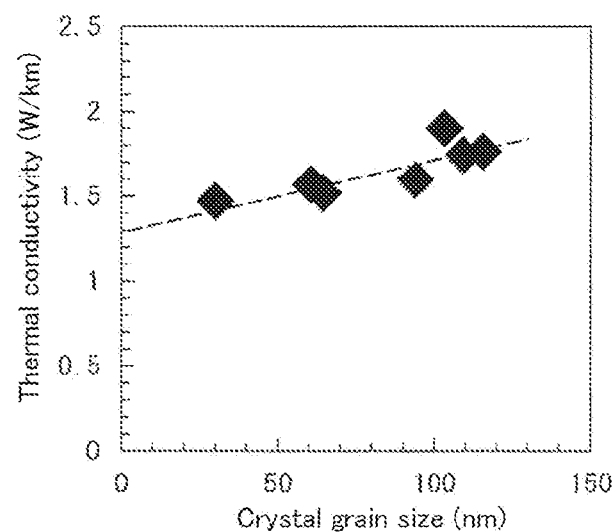
FIG. 10 is a graph showing a relationship between a crystal grain size and a thermal conductivity in thermoelectric conversion materials according to an embodiment of the present invention.
Figure 11:
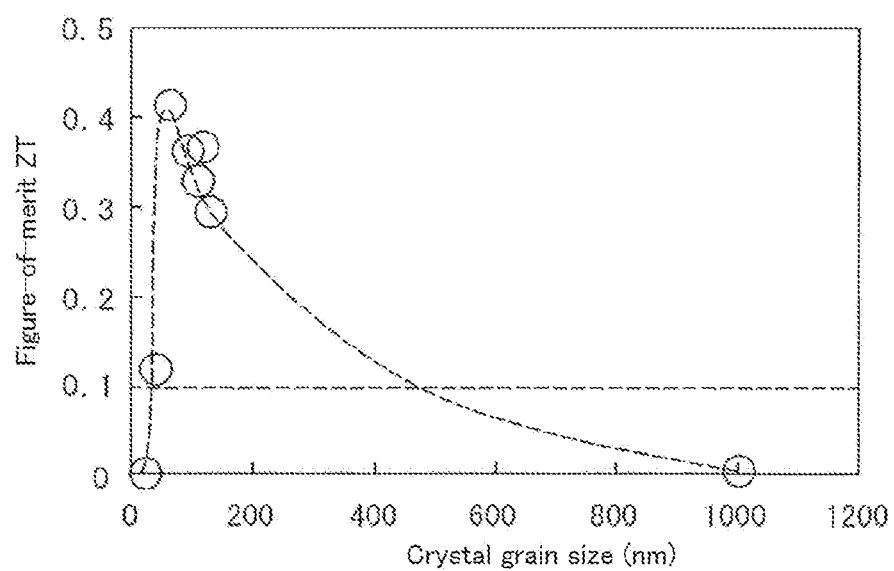
FIG. 11 is a graph showing a relationship between a crystal grain size and a figure-of-merit ZT in thermoelectric conversion materials according to the present invention.
Figure 12:
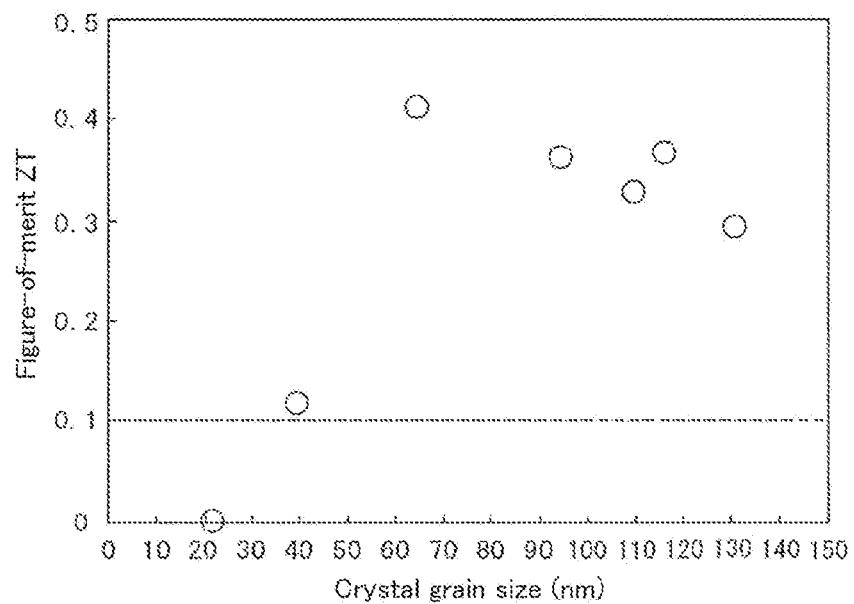
FIG. 12 is a graph obtained by expanding the horizontal axis of FIG. 11.

The above results are shown in FIGS. 11 and 12. Figure 10 is a graph obtained by plotting crystal grain sizes on the horizontal line and figure-of-merits ZT on the vertical line and FIG. 12 is a graph obtained by expanding the horizontal axis of FIG. 11. In the cases of Nos. 1-2 to 1-7 that are thermoelectric conversion materials according to the present invention, the crystal grain sizes are in the range of 39.3 nm to 130.6 nm and, in every example, the figure-of-merit ZT exceeds 0.1 and is higher than that of a thermoelectric conversion material comprising an Fe$_2$VAl type alloy that will be described later. In those cases, in the cases of Nos. 1-3 to 1-7 having crystal grain sizes of not less than 64.3 nm, the figure-of-merits ZT exceed 0.3.

In contrast, in the case of No. 1-1 having a small crystal grain size of 21.7 nm, the figure-of-merit ZT is 0.0017 and is lower than that of a conventional material of an Fe$_2$VAl type alloy. Further, in the case of No. 1-8 having a crystal grain size of 1,000 nm, the figure-of-merit ZT is 0.0026 and is also lower than that of a conventional material.

In this way, it is obvious that a thermoelectric conversion material according to the present invention makes a figure-of-merit improve by controlling a crystal grain size to 39.3 nm to 130.6 nm.

Meanwhile, even when a crystal grain size is 500 nm, a thermoelectric conversion material having a figure-of-merit ZT higher than a conventional material is obtained.

EXAMPLE 2

A thermoelectric conversion material according to the present invention is produced by substituting Sn for a part of Si.

Fe, Ti, V, Si, and Sn are used as materials and V is substituted for a part of Ti and the raw materials are weighed so as to have an Fe$_2$Ti(Si.Sn) type alloy composition shown in Table 2.

Successively, the thermoelectric conversion material shown in Table 2 is produced similarly to Example 1. The crystal grain size of the thermoelectric conversion material is 51.8 nm.

Obtained measurement results are shown in Table 2. A thermoelectric conversion material having a figure-of-merit ZT of 0.25 which is larger than that of a conventional material is obtained.

TABLE 2

| No. | Fe (at %) | Ti (at %) | V (at %) | Si (at %) | Sn (at %) | Crystal grain size (nm) | S (uV/K) | ρ (uΩm) | k (W/Km) | ZT |
|---|---|---|---|---|---|---|---|---|---|---|
| 2-1 | bal | 21.4 | 2.4 | 25.3 | 1.3 | 51.8 | −152.9 | 16.9 | 1.9 | 0.25 |

EXAMPLE 3

Thermoelectric conversion materials are produced similarly to Example 1 except that the compositions shown in Tables 3 and 4 including at least one element of Cu and V are used. Table 3 shows the measurement results of Examples 3-1 to 3-11. Table 4 shows the measurement results of Examples 3-12 to 3-20.

TABLE 3

| | Fe (at %) | Cu (at %) | Ti (at %) | V (at %) | Si (at %) | Crystal grain size (nm) | Seeback coefficient S (μV/K) | Electric resistivity ρ (μΩm) | Thermal conductivity κ (W/km) | Output factor (mW/K$^2$m) | Figure-of-merit ZT |
|---|---|---|---|---|---|---|---|---|---|---|---|
| EXAMPLE 3-1 | 49.52 | 0.00 | 21.43 | 2.38 | 26.67 | 30.90 | −142.2 | 12.9 | 2.25 | 1.52 | 0.24 |
| EXAMPLE 3-2 | 49.40 | 0.25 | 21.38 | 2.38 | 26.59 | 27.54 | −141.8 | 24.3 | 2.23 | 0.83 | 0.13 |
| EXAMPLE 3-3 | 48.90 | 1.25 | 21.16 | 2.35 | 26.34 | 47.48 | −155.4 | 15.3 | 2.2 | 1.58 | 0.25 |
| EXAMPLE 3-4 | 48.78 | 1.50 | 21.11 | 2.35 | 26.26 | 48.06 | −172.5 | 20.2 | 2.12 | 1.47 | 0.24 |
| EXAMPLE 3-5 | 48.66 | 1.75 | 21.05 | 2.34 | 26.20 | 64.22 | −123.7 | 6.88 | 2.3 | 2.22 | 0.34 |
| EXAMPLE 3-6 | 49.26 | 1.00 | 21.35 | 1.86 | 26.53 | 49.80 | −168.1 | 13.9 | 3.02 | 2.03 | 0.23 |
| EXAMPLE 3-7 | 49.26 | 1.00 | 20.89 | 2.32 | 26.53 | 48.78 | −157 | 8.78 | 2.64 | 2.81 | 0.37 |
| EXAMPLE 3-8 | 49.26 | 1.00 | 20.43 | 2.79 | 26.52 | 41.21 | −148 | 4.26 | 1.83 | 5.14 | 0.98 |
| EXAMPLE 3-9 | 49.26 | 1.00 | 19.96 | 3.25 | 26.53 | 36.67 | −143 | 6.32 | 2.23 | 3.24 | 0.50 |
| EXAMPLE 3-10 | 49.20 | 1.12 | 22.25 | 0.93 | 26.50 | 51.65 | −138.7 | 8.9 | 2.62 | 2.16 | 0.29 |
| EXAMPLE 3-11 | 49.20 | 1.12 | 21.79 | 1.39 | 26.50 | 51.43 | −129.7 | 8.04 | 2.99 | 2.09 | 0.24 |

TABLE 4

|  | Fe (at %) | Cu (at %) | Ti (at %) | V (at %) | Si (at %) | Sn (at %) | Crystal grain size (nm) | Seeback coefficient S (μV/K) | Electric resistivity ρ (μΩm) | Thermal conductivity κ (W/km) | Output factor (mW/K²m) | Figure-of-merit ZT |
| --- | --- | --- | --- | --- | --- | --- | --- | --- | --- | --- | --- | --- |
| EXAMPLE 3-12 | 49.45 | 0.75 | 19.54 | 3.72 | 25.88 | 0.66 | 35 | −129.2 | 8.46 | 2.32 | 1.97 | 0.3 |
| EXAMPLE 3-13 | 49.39 | 0.75 | 19.08 | 4.19 | 24.6 | 1.99 | 22.5 | −80.2 | 6.42 | 1.47 | 1 | 0.24 |
| EXAMPLE 3-14 | 49.01 | 1.50 | 20.79 | 2.31 | 24.41 | 1.98 | 37 | −138.2 | 9.35 | 2.33 | 2.04 | 0.31 |
| EXAMPLE 3-15 | 49.26 | 1 | 21.36 | 1.86 | 25.86 | 0.66 | 31.6 | −141.3 | 18 | 2.93 | 1.11 | 0.13 |
| EXAMPLE 3-16 | 49.26 | 1 | 20.90 | 2.32 | 25.86 | 0.66 | 34.2 | −167.1 | 29.2 | 3.89 | 1.38 | 0.12 |
| EXAMPLE 3-17 | 49.26 | 1 | 19.97 | 3.25 | 25.86 | 0.66 | 27 | −132.7 | 13.2 | 1.43 | 1.34 | 0.33 |
| EXAMPLE 3-18 | 49.26 | 1 | 20.89 | 2.32 | 24.54 | 1.99 | 39.3 | −136.3 | 10.1 | 3.01 | 1.83 | 0.21 |
| EXAMPLE 3-19 | 49.26 | 1 | 20.42 | 2.79 | 24.54 | 1.99 | 49.2 | −141.9 | 4.8 | 2.66 | 4.19 | 0.55 |
| EXAMPLE 3-20 | 49.26 | 1 | 10.96 | 3.25 | 24.54 | 1.99 | 42.7 | −131.5 | 8.24 | 1.38 | 2.1 | 0.53 |

Figure 15:
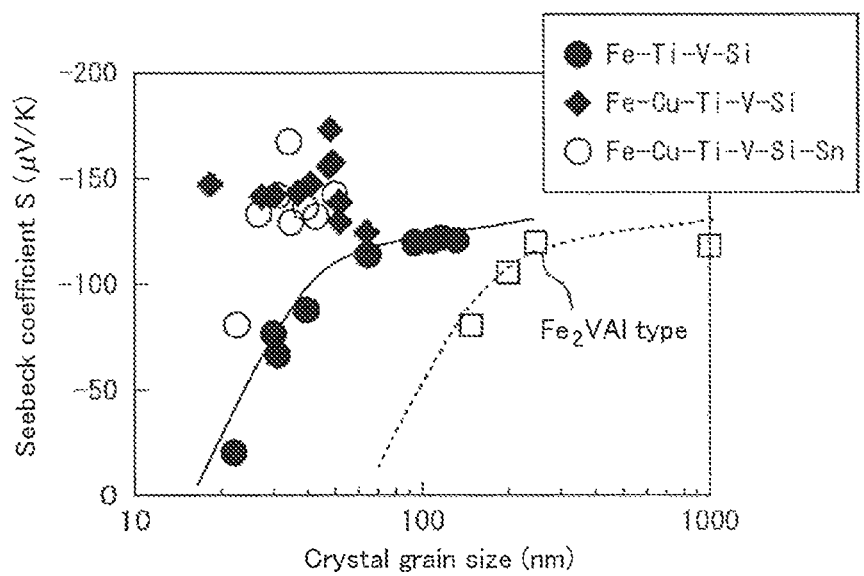
FIG. 15 is a graph showing a relationship between a Seebeck coefficient and a crystal grain size.
Figure 16:
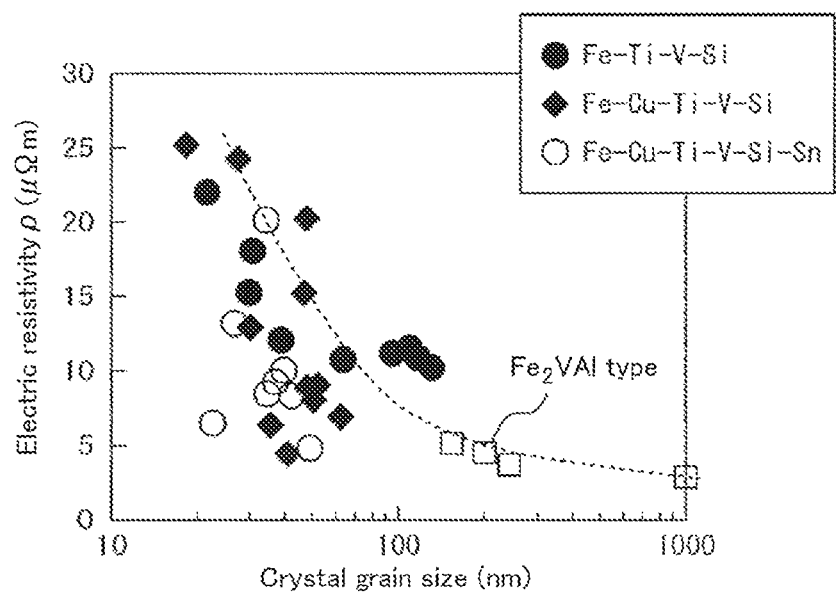
FIG. 16 is a graph showing a relationship between an electric resistivity and a crystal grain size.

The relationships of a Seebeck coefficient S and an electric resistivity ρ with a crystal grain size, those being obtained from Tables 1, 3, and 4, are shown in FIGS. 15 and 16. FIG. 15 is a graph showing a relationship between a Seebeck coefficient S and a crystal grain size. FIG. 16 is a graph showing a relationship between an electric resistivity ρ and a crystal grain size. A crystal grain size is shown on the horizontal axis in each of FIGS. 15 and 16, a Seebeck coefficient S is shown on the vertical axis in FIG. 15, and an electric resistivity ρ is shown on the vertical axis in FIG. 16.

In the graphs in FIGS. 15 and 16, the results of Nos. 1-1 to 1-8 are shown as "Fe—Ti—V—Si", the results of Nos. 3-1 to 3-11 are shown as "Fe—Cu—Ti—V—Si", and the results of Nos. 3-12 to 3-20 are shown as "Fe—Cu—Ti—V—Si—Sn" (the same shall apply to FIGS. 17 to 19 that will be stated later).

Meanwhile, in the graphs of FIGS. 15 and 16, the Seebeck coefficients S and electric resistivities ρ of Fe₂VAl type full-Heusler alloys measured similarly are shown with the dotted lines (the same shall apply hereunder) for reference. Here, the Seebeck coefficients S and electric resistivities ρ of Fe₂VAl type full-Heusler alloys having crystal grain sizes exceeding 200 nm are the values read from the data described in Non-patent Literature 2 for example. Further, although measurement results in the cases of crystal grain sizes of not less than 100 nm to less than 200 nm are not described in Non-patent Literature 2, the Seebeck coefficients S and the electric resistivities ρ when the crystal grain sizes are in this range in FIGS. 15 and 16 are estimated from the tendency of data when crystal grain sizes exceed 200 nm.

As shown in FIG. 15, it is obvious that, in the thermoelectric conversion materials according to the present examples (Nos. 1-2 to 1-7, Nos. 3-1 to 3-11, and Nos. 3-12 to 3-20), Seebeck coefficients S do not so much decrease even when crystal grain sizes are fractionized to not more than 200 nm.

On the other hand, as shown in FIG. 16, in the thermoelectric conversion materials according to the present examples, the electric resistivities ρ increase in response to the decrease of the crystal grain sizes.

Figure 17:
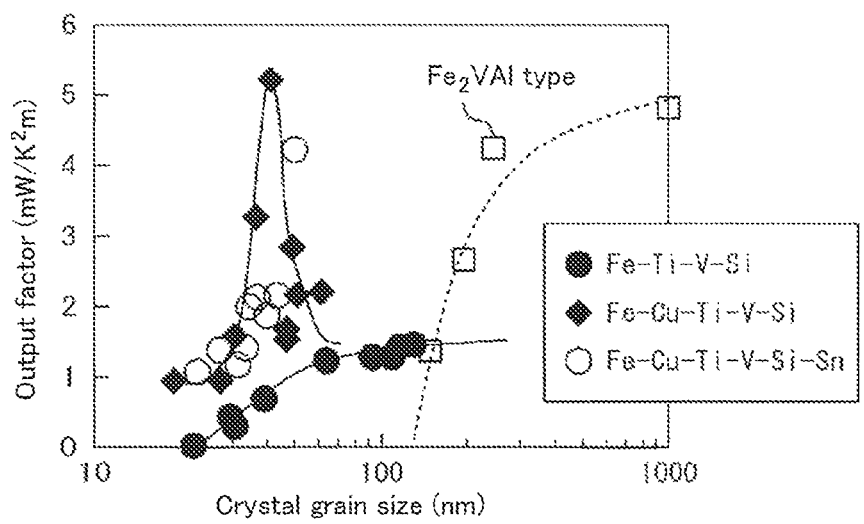
FIG. 17 is a graph showing a relationship between an output factor and a crystal grain size.
Figure 18:
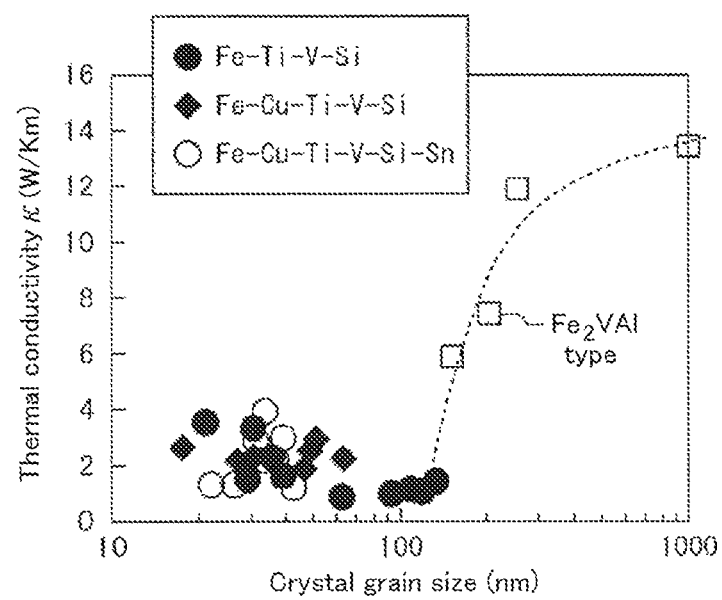
FIG. 18 is a graph showing a relationship between a thermal conductivity and a crystal grain size.
Figure 19:
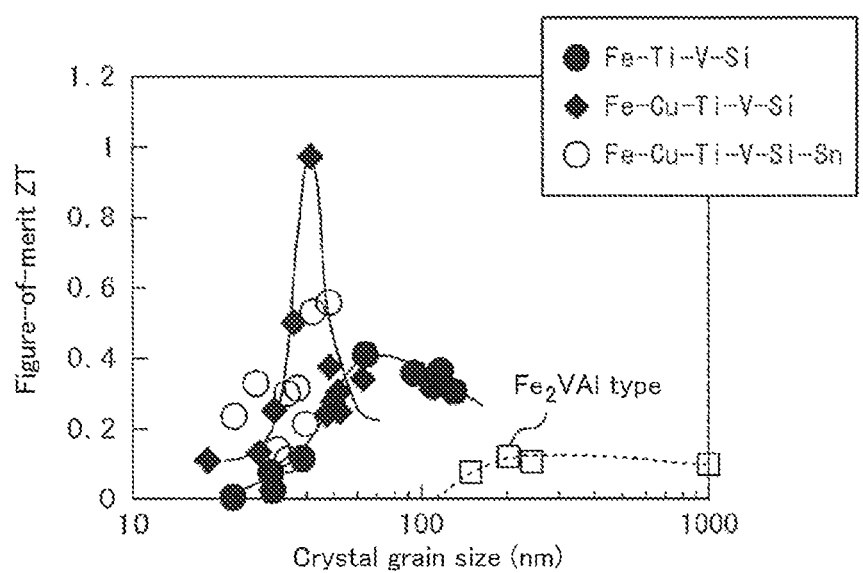
FIG. 19 is a graph showing a relationship between a figure-of-merit and a crystal grain size.

Successively, the relationships of an output factor, a thermal conductivity κ, and a figure-of-merit ZT with a crystal grain size, those being obtained from Tables 1, 3, and 4, are shown in FIGS. 17 to 19. FIG. 17 is a graph showing a relationship between an output factor (S²/ρ) and a crystal grain size. FIG. 18 is a graph showing a relationship between a thermal conductivity κ and a crystal grain size. FIG. 19 is a graph showing a relationship between a figure-of-merit ZT and a crystal grain size.

As shown in FIG. 17, it is obvious that, in the thermoelectric conversion materials according to the present examples, unlike a thermoelectric conversion material comprising an Fe₂VAl type full-Heusler alloy, the output factors hardly decrease even when crystal grain sizes are fractionized to about 200 nm or less. It is obvious that, among those materials, in the thermoelectric conversion materials according to the examples 3-1 to 3-20 comprising Fe₂TiA type full-Heusler alloys containing Cu, the output factors are high.

Further, as shown in FIG. 18, it is obvious that, in the thermoelectric conversion materials according to the present examples, the thermal conductivities κ are kept low when the crystal grain sizes are about 200 nm or less.

Furthermore, as shown in FIG. 19, it is obvious that, in the thermoelectric conversion materials according to the present examples, in comparison with a thermoelectric conversion material comprising an Fe₂VAl type full-Heusler alloy, the figure-of-merits ZT increase even when the crystal grain sizes are fractionized until the crystal grain sizes decrease to about 200 nm or less. The reason is that the output factors do not lower as stated earlier.

In those materials, in the thermoelectric conversion materials according to the present examples of "Fe—Cu—Ti—V—Si" and "Fe—Cu—Ti—V—Si—Sn" in which Cu and V are used, the figure-of-merits ZT are high in comparison with the thermoelectric conversion materials of "Fe—Ti—V—Si" in Nos. 1-2 to 1-7 and No. 3-1 in which Cu is not contained. It is therefore obvious that it is more desirable to contain Cu or substitute V in order to obtain a high thermoelectric conversion characteristic. Further, it is obvious that the figure-of-merits ZT when crystal grain sizes are in the range of not less than 36.67 nm to not more than 48.78 are higher in "Fe—Cu—Ti—V—Si" of Nos. 3-1 to 3-11 in which only Si is used as the element A than in "Fe—Cu—Ti—V—Si—Sn" of Nos. 3-12 to 3-20 in which Si and Sn are used as the element A.

Figure 20:
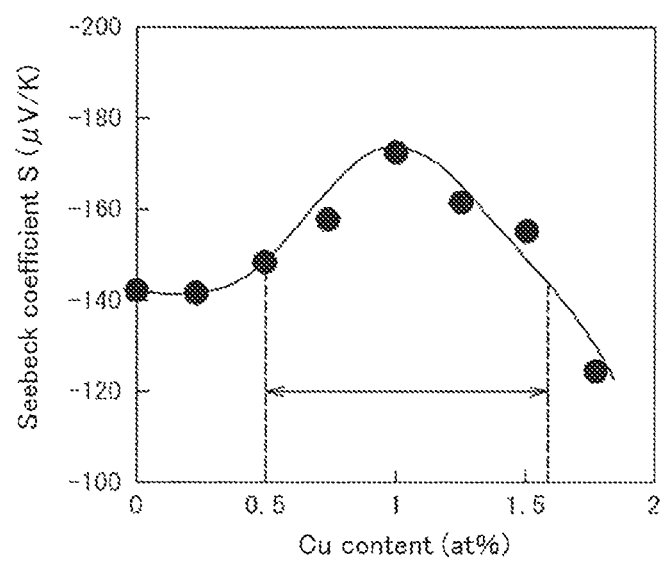
FIG. 20 is a graph showing a relationship between a Seebeck coefficient and a quantity of substituent Cu.
Figure 21:
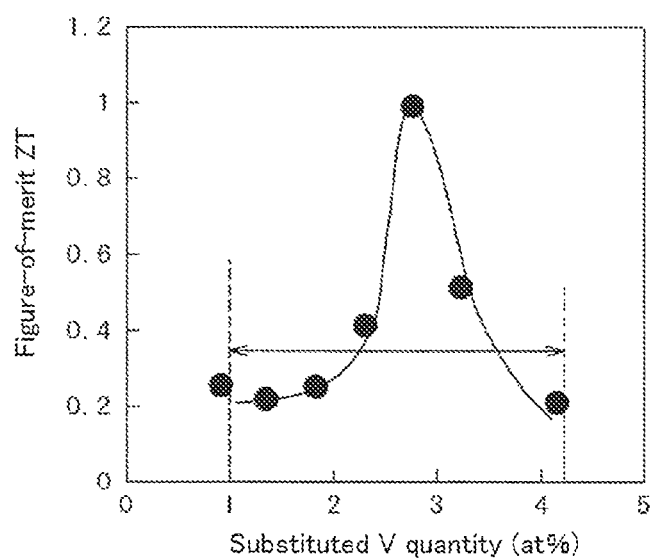
FIG. 21 is a graph showing a relationship between a figure-of-merit and a quantity of substituent V.

Successively, the relationships between a Seebeck coefficient S and a Cu content and between a figure-of-merit ZT and a quantity of substituent V, those being obtained from Nos. 3-1 to 3-11 and Nos. 3-12 to 3-20, are shown in FIGS. 20 and 21. FIG. 20 is a graph showing a relationship between a Seebeck coefficient S and a Cu content. FIG. 21 is a graph showing a relationship between a figure-of-merit ZT and a quantity of substituent V. As it will be stated below, it has been found that, in a thermoelectric conversion material comprising an Fe₂TiA type full-Heusler alloy, a Seebeck coefficient S or a figure-of-merit ZT has a strong correlation with a Cu content or a quantity of substituent V.

As shown in FIG. 20, the absolute value of a Seebeck coefficient S is larger when a Cu content is 0.5 at % to 1.6 at % than when Cu is not contained, namely when a Cu content is zero. As a result, the absolute value of a Seebeck coefficient S in an Fe₂TiA type full-Heusler alloy can be larger than a case of not containing copper.

Further, as shown in FIG. 21, when a quantity of substituent V is 1.0 at % to 4.2 at %, the figure-of-merit ZT of a thermoelectric conversion material comprising an Fe$_2$TiA type full-Heusler alloy is at the same level as or larger than the figure-of-merit ZT of a thermoelectric conversion material comprising an Fe$_2$VAl type full-Heusler alloy. Consequently, a V content in an Fe$_2$TiA type full-Heusler alloy is desirably 1.0 at % to 4.2 at %. As a result, the figure-of-merit ZT of a thermoelectric conversion material comprising an Fe$_2$TiA type full-Heusler alloy can be at the same level as or larger than the figure-of-merit ZT of a thermoelectric conversion material comprising an Fe$_2$VAl type full-Heusler alloy. Meanwhile, when a quantity of substituent V is 1.0 at % to 4.2 at %, y in the aforementioned composition formula (Ch 1) satisfies the expression $|y|\leq 0.25$.

Meanwhile, even when V is not used and Cu is contained in the range of not less than 0.5 at % to not more than 1.6 at % when the whole composition is regarded as 100 at %, it has been confirmed that a figure-of-merit improves although it is not so much as the case of substituting V.

EXAMPLE 4

Thermoelectric conversion materials having the compositions shown in Table 5 represented by $Fe_{2+\sigma}(Ti_{1-x}M_x)_{1+y}(Si_{1-w}N_w)_{1+z}$ are produced.

Fe, Ti, Si, and V are used as materials and the raw materials are weighed so as to obtain each of the compositions shown in Table 5.

The raw materials are contained in an SUS container and mixed with SUS balls 10 mm in diameter in an inert gas atmosphere. Successively, mechanical alloying is applied for 20 hours or longer in a planetary ball mill while the condition of orbital speed is varied in the range of 200 rpm to 500 rpm and amorphized alloy powder is obtained. The amorphized alloy powder is contained in a carbon die or a tungsten carbide die and sintered under the pressures of 40 MPa to 5 GPa in an inert gas atmosphere while pulsed current is applied. With regard to the temperature condition, the temperature is raised to 550° C. to 700° C. and retained at the highest temperature for 3 to 180 minutes. Successively, the sintered material is cooled to room temperature and an intended thermoelectric conversion material is obtained.

The crystal grain size of an obtained thermoelectric conversion material is evaluated with a transmission electron microscope (TEM) and an X-ray diffractometer (XRD). Further, a thermal conductivity κ is obtained by measuring a thermal diffusivity by a laser flash method and measuring a specific heat by DSC. Furthermore, an electric resistivity ρ and a Seebeck coefficient S are measured with a ZEM made by ULVAC RIKO, Inc. in the same manner as before.

It is obvious that any of the compositions has an excellent Seebeck coefficient S and is a promising composition as a thermoelectric conversion material.

Figure 6:
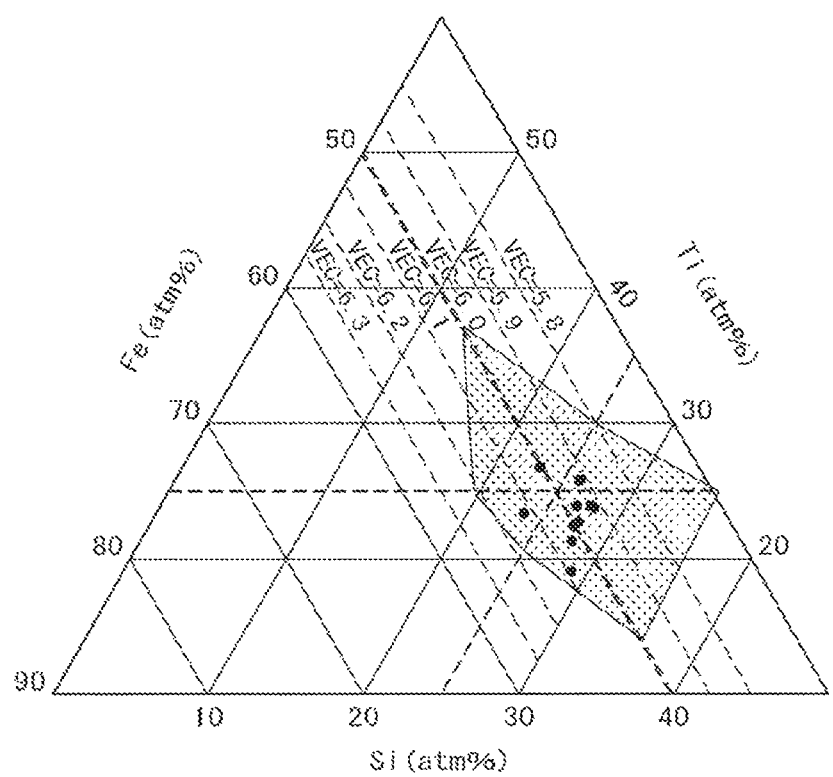
FIG. 6 is a ternary alloy phase diagram showing the composition range of an Fe—Ti—Si type full-Heusler alloy according to an embodiment of the present invention.

Meanwhile, some compositions are synthesized on the basis of FIGS. 4A to 4G in order to know a full scope of an appropriate composition range. The implemented composition range is shown as a ternary alloy phase diagram in FIG. 6 and the relationship between a Seebeck coefficient and a VEC is summarized in FIG. 7 and Table 5.

TABLE 5

| Composition | | VEC | S |
|---|---|---|---|
| $Fe_{2.04}(Ti_{1-x}V_x)_{0.86}Si_{1.1}$ | x = 0.0 | 6.03922 | −5.2 |
| $Fe_{2.04}(Ti_{1-x}V_x)_{0.86}Si_{1.1}$ | x = 0.2 | 6.08236 | −162.2 |
| $Fe_{2.04}(Ti_{1-x}V_x)_{0.86}Si_{1.1}$ | x = 0.4 | 6.12549 | −112.4 |
| $Fe_{2.04}(Ti_{1-x}V_x)_{0.86}Si_{1.1}$ | x = 0.6 | 6.16863 | −96.2 |
| 継成 | | VEC | S |
| $Fe_{2.00}(Ti_{1-x}V_x)_{0.91}Si_{1.09}$ | x = 0.0 | 6 | 5.6 |
| $Fe_{2.00}(Ti_{1-x}V_x)_{0.91}Si_{1.09}$ | x = 0.05 | 6.011 | −83.4 |
| $Fe_{2.00}(Ti_{1-x}V_x)_{0.92}Si_{1.09}$ | x = 0.08 | 6.019 | −186.2 |
| $Fe_{2.00}(Ti_{1-x}V_x)_{0.91}Si_{1.09}$ | x = 0.10 | 6.023 | −223 |
| $Fe_{2.00}(Ti_{1-x}V_x)_{0.91}Si_{1.09}$ | x = 0.15 | 6.034 | −184.4 |
| $Fe_{2.00}(Ti_{1-x}V_x)_{0.91}Si_{1.09}$ | x = 0.4 | 6.09 | −132.2 |
| $Fe_{2.1}(Ti_{1-x}V_x)_{0.76}Si_{1.15}$ | x = 0.25 | 6.14 | −109 |
| 継成 | | VEC | S |
| $Fe_{1.98}(Ti_{1-x}V_x)_{0.95}Si_{1.07}$ | x = 0.05 | 5.99 | −162.2 |
| $Fe_{1.98}(Ti_{1-x}V_x)_{0.95}Si_{1.07}$ | x = 0.12 | 6.009 | −230.6 |
| $Fe_{1.91}(Ti_{1-x}V_x)_{1.04}Si_{1.04}$ | x = 0.5 | 6.04 | −112.4 |

Figure 7:
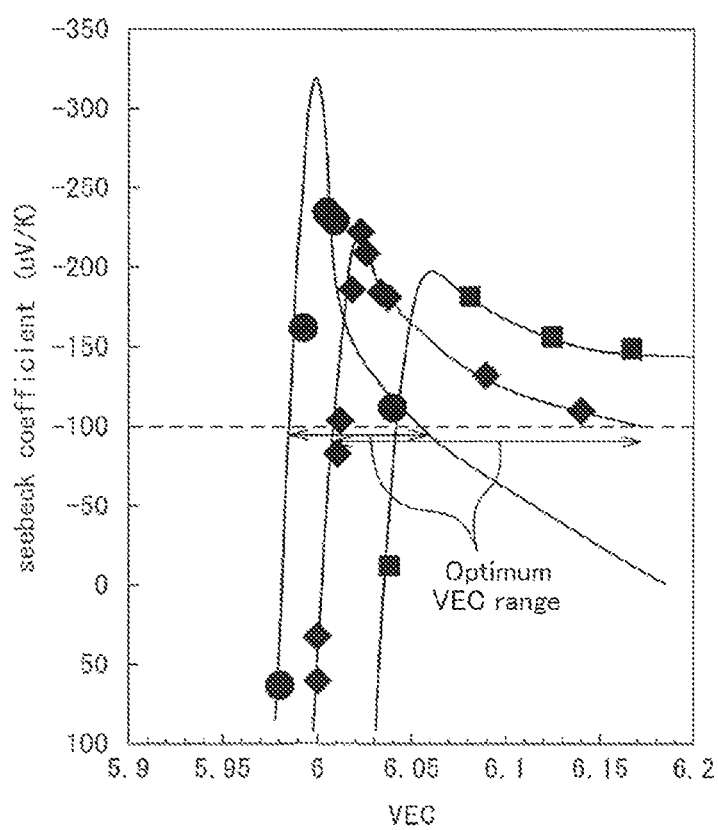
FIG. 7 is a graph showing a relationship between a Seebeck coefficient and a VEC in Fe—Ti—Si type full-Heusler alloys according to an embodiment of the present invention.
Figure 8:
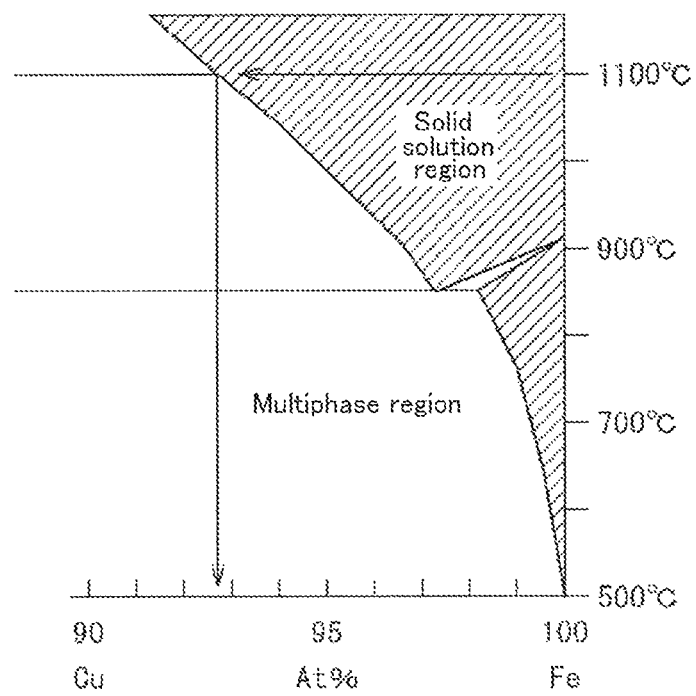
FIG. 8 is a binary phase diagram of Cu—Fe.

From the results of FIG. 7 and Table 5, it is confirmed that performance is sufficiently high in the composition range derived from FIGS. 4A to 4G and FIGS. 2A to 2F. Further, an appropriate substitution quantity of a substituent material in each of alloy compositions is identified from the relationship between a Seebevk coefficient and a VEC shown in FIG. 7. Since a Seebeck coefficient has extreme values at the VEC values before and after a VEC value where the polarity of a Seebeck coefficient is inversed (not necessarily VEC=6 in the case of a nonstoichiometric composition), a Seebeck coefficient is particularly high in the case of such a composition or a quantity of a substituent element as to yield such a VEC. By actual experimental values, a high thermoelectric conversion characteristic is obtained in a range of VEC values close to VEC=±0.2 in terms of a deviation from a center value of a VEC. From the example therefore, a VEC takes an optimum value by satisfying the expression $0<|\Delta VEC|\leq 0.2$.

Although V is used as a substituent material in the present example, the effect of improving a Seebeck coefficient S is obtained also by: selecting at least any one of Cu, Nb, Al, Ta, Cr, Mo, W, Hf, Ge, Ga, In, P, B, Bi, and Zr as each of the substituent elements N and M other than V; and selecting a combination of the alloy contents x and w and the substituent materials M and N so that the expression $0<|\Delta VEC|\leq 0.2$ may be satisfied. Effect is however recognized particularly by using V as a substituent material and the substitution quantity x desirably satisfies the expression $|x|\leq 0.25$.

Further, when such substituent materials are used, the composition is desirably configured so that the sum of the composition ratios of the substituent materials may be smaller than the composition ratio of Ti. This is because the composition ratios of the substituent materials already deviate from a range as an Fe$_2$TiA type alloy explained in (b) of FIG. 3 if the composition ratios of the substituent materials are larger. Further, when a VEC is controlled only by substituent elements, it is desirable to calculate the sum of the contributions to a VEC by the substituent elements so that a VEC may have values of x and w satisfying an expression $0<|\Delta VEC|\leq 0.2$ when, in a composition formula represented by $Fe_{2+\sigma}(Ti_{1-x}M_x)_{1-y}(A_{1-w}N_w)_{1+z}$, a VEC is represented by a function of σ, x, y, w, and z as follows, $VEC(\sigma,x,y,w,z)=[8X(2+\sigma)+\{4X(1-x)+(\text{valence electron number of }M)Xx\}X(1+y)+\{4X(1-w)+(\text{valence electron number of }N)Xw\}X(1+z)]/4$, σ={of Fe in any one of the regions α, β, and γ)−50}/25,
y={(at % of Ti in any one of the regions α, β, and γ)−25}/25,
z={(at % of A in any one of the regions α, β, and γ)−25}/25,
and a variation ΔVEC of a VEC is represented by ΔVEC=VEC (σ, x, y, w, z)−VEC (σ, 0, y, 0, z).

Figure 9:
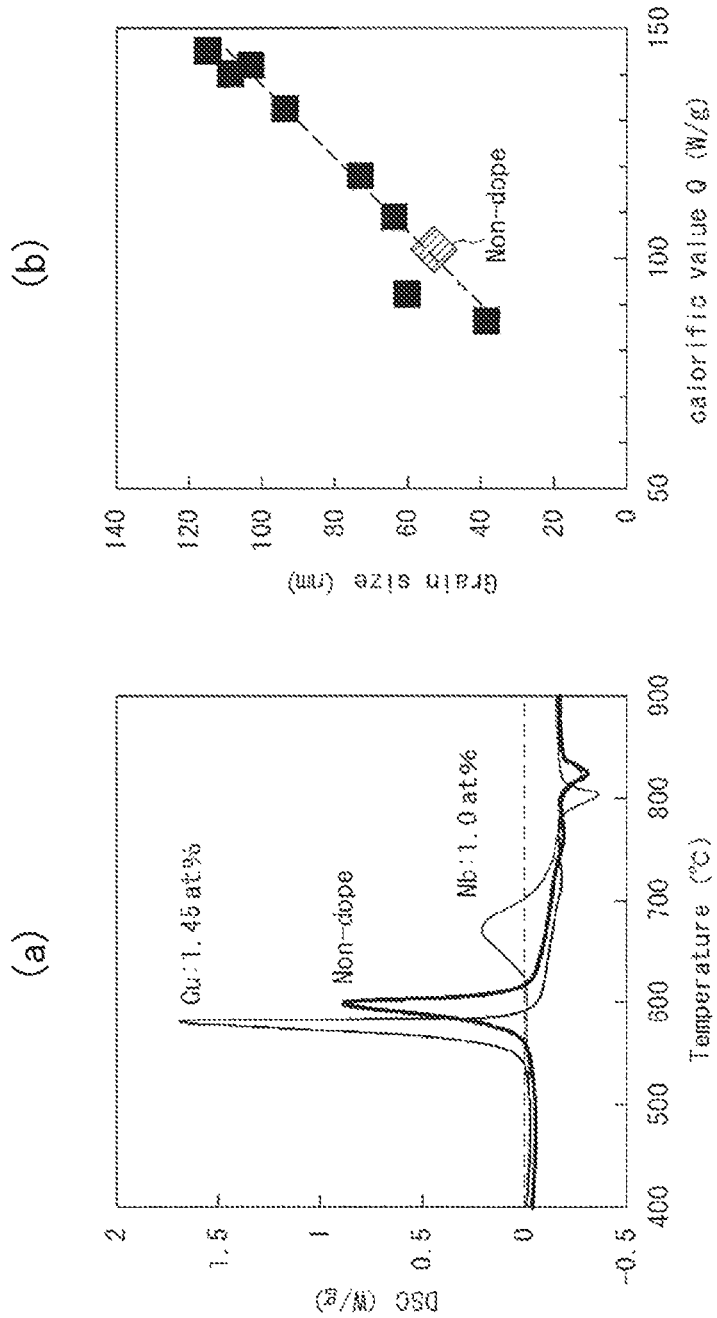
FIG. 9 represents characteristic diagrams of thermoelectric conversion materials according to an embodiment of the present invention: (a) is a graph showing the temperature dependency of a DSC and (b) is a graph showing a relationship between a crystallization calorific value Q and a crystal grain size.

On this occasion, heat generation is observed at a crystallization temperature as shown in (a) of FIG. 9 when amorphized powder is measured by DSC.

Further, a relationship between a calorific value Q and a grain size (crystal grain size) in crystallization is shown in (b) of FIG. 9. It is obvious that a crystal grain size is controllable at the order of tens of nanometers by increasing or decreasing a calorific value Q.

Furthermore, a relationship between a thermal conductivity and a crystal grain size is shown in FIG. 10. From the result, the effect of decreasing a thermal conductivity to not more than 2 W/Km by controlling a crystal grain size to 30 nm to 130 nm is confirmed. Moreover, an electric resistivity ρ can be inhibited from increasing.

In this way, according to the present embodiment, it is possible to provide a thermoelectric conversion material that has a low thermal conductivity and eliminates the tradeoff between the lowering of a thermal conductivity and the increase of an electric resistivity, those being caused by fractionizing a crystal grain size, while the attenuation of a Seebeck coefficient and the increase of the electric resistivity are avoided.

REFERENCE SIGNS LIST

10: thermoelectric conversion module,
11: p-type thermoelectric conversion unit,
12: n-type thermoelectric conversion unit,
13: electrode,
14: upper substrate,
15: lower substrate.

The invention claimed is:

1. A thermoelectric conversion material comprising a full-Heusler alloy having a p-type or an n-type, wherein:
the full-Heusler alloy has a composition formula of $Fe_{2+\sigma}(Ti_{1-x}M_x)_{1+y}(A_{1-w}N_w)_{1+z}$ type, where A is at least one element selected from Si and Sn;
a VEC is represented by a function of σ, x, y, w, and z, and expressed by VEC(σ, x, y, w, z)=[8X(2+σ)+{4X(1−x)+(valence electron number of M)Xx}X(1+y)+{4X(1−w)+(valence electron number of N)Xw}X(1+z)]/4,
σ={(at % of Fe in any one of regions α, β, and γ)−50}/25,
y={(at % of Ti in any one of regions α, β, and γ)−25}/25,
z={(at % of A in any one of regions α, β, and γ)−25}/25,
and has values of x and w satisfying an expression 0<|ΔVEC|<0.2 when a variation ΔVEC of the VEC is represented by ΔVEC=VEC(σ, x, y, w, z)−VEC(σ, 0, y, 0, z); and
an average grain size of crystal grains is not less than 30 nm to not more than 500 nm, wherein
the values of σ, y, and z allowing the full-Heusler alloy to fall within a region α surrounded by points (50, 37, 13), (50, 14, 36), (45, 30, 25), (39.5, 25, 35.5), (54, 21, 25), and (55.5, 25, 19.5) in terms of (Fe, Ti, A) in at % in an Fe—Ti-A ternary alloy phase diagram.

2. The thermoelectric conversion material according to claim 1, wherein the average grain size of crystal grains in the full-Heusler alloy is not less than 35 nm to not more than 200 nm.

3. The thermoelectric conversion material according to claim 1, wherein the full-Heusler alloy represented by the composition formula $Fe_{2+\sigma}(Ti_{1-x}M_x)_{1+y}(A_{1-w}N_w)_{1+z}$ has values of σ, y, and z allowing the full-Heusler alloy to fall within a region β surrounded by points (40, 25, 35), (47.5, 27.5, 25), (50, 17, 33), (50, 35, 15), (52.8, 25, 22.2), and (52.2, 22.8, 25) in terms of (Fe, Ti, A) in at % in an Fe—Ti-A ternary alloy phase diagram.

4. The thermoelectric conversion material according to claim 1, wherein the full-Heusler alloy represented by the composition formula $Fe_{2+\sigma}(Ti_{1-x}M_x)_{1+y}(A_{1-w}N_w)_{1+z}$ has values of σ, y, and z allowing the full-Heusler alloy to fall within a region γ surrounded by points (43.9, 25, 31.1), (49.2, 25.8, 25), (50, 23, 27), (50, 32.6, 17.4), (51, 25, 24), and (51, 24, 25) in terms of (Fe, Ti, A) in at % in an Fe—Ti-A ternary alloy phase diagram.

5. The thermoelectric conversion material according to claim 1, wherein V is substituted in a range of more than 0 at % to not more than 5.0 at % for Ti in the composition formula when the whole composition is regarded as 100 at %.

6. The thermoelectric conversion material according to claim 1, wherein Cu is contained in a range of not less than 0.5 at % to not more than 1.6 at % when the whole composition is regarded as 100 at %.

7. The thermoelectric conversion material according to claim 5, wherein the average grain size of crystal grains in the full-Heusler alloy is not less than 30 nm to not more than 140 nm.

8. The thermoelectric conversion material according to claim 1, wherein each element M and N is at least any one of Cu, Nb, V, Al, Ta, Cr, Mo, W, Hf, Ge, Ga, In, P, B, Bi, and Zr.

9. The thermoelectric conversion material according to claim 8, wherein the element M is V and a substitution quantity x satisfies an expression |x|≤0.25.

10. A process for producing a thermoelectric conversion material comprising;
producing a full-Heusler alloy having a p-type or an n-type:
preparing a raw material having a composition formula of $Fe_{2+\sigma}(Ti_{1-x}M_x)_{1+y}(A_{1-w}N_w)_{1+z}$ type, where A is at least one element selected from Si and Sn;
alloying the raw material to form an amorphous alloy;
representing a VEC by a function of σ, x, y, w, and z, being expressed by VEC(σ, x, y, w, z)=[8X(2+σ)+{4X(1−x)+(valence electron number of M)Xx}X(1+y)+{4X(1−w)+(valence electron number of N)Xw}X(1+z)]/4,
σ={(at % of Fe in any one of regions α, β, and γ)−50}/25,
y={(at % of Ti in any one of regions α, β, and γ)−25}/25,
z={(at % of A in any one of regions α, β, and γ)−25}/25,
and has values of x and w satisfying an expression 0<|ΔVEC|≤0.2 when a variation ΔVEC of the VEC is represented by ΔVEC=VEC(σ, x, y, w, z)−VEC(σ, 0, y, 0, z); and
successively heating the alloy so that an average grain size of crystal grains is not less than 30 nm to not more than 500 nm, wherein
the values of σ, y, and z allowing the raw material to fall within region α surrounded by points (50, 37, 13), (50, 14, 36), (45, 30, 25), (39.5, 25, 35.5), (54, 21, 25), and (55.5, 25, 19.5) in terms of (Fe, Ti, A) in at % in an Fe—Ti-A ternary alloy phase diagram.

11. The process for producing a thermoelectric conversion material according to claim 10, wherein V is substituted in a range of more than 0 at % to not more than 5.0 at % for Ti in the composition formula when the whole raw material is regarded as 100 at %.

12. The process for producing a thermoelectric conversion material according to claim 10, wherein Cu is contained in a of not less than 0.5 at % to not more than 1.6 at % when the whole composition is regarded as 100 at %.

13. The process for producing a thermoelectric conversion material according to claim 10, wherein the full-Heusler alloy represented by the composition formula $Fe_{2+o}(Ti_{1-x}M_x)_{1+y}(A_{1-w}N_w)_{1+z}$ has values of σ, y, and z allowing the full-Heusler alloy to fall within a region β surrounded by points (40, 25, 35), (47.5, 27.5, 25), (50, 17, 33), (50, 35, 15), (52.8, 25, 22.2), and (52.2, 22.8, 25) in terms of (Fe, Ti, A) in at % in an Fe—Ti-A ternary alloy phase diagram.

14. The process for producing a thermoelectric conversion material according to claim 10, wherein the full-Heusler alloy represented by the composition formula $Fe_{2+o}(Ti_{1-x}M_x)_{1+y}(A_{1-w}N_w)_{1+z}$ has values of σ, y, and z allowing the full-Heusler alloy to fall within a region γ surrounded by points (43.9, 25, 31.1), (49.2, 25.8, 25), (50, 23, 27), (50, 32.6, 17.4), (51, 25, 24), and (51, 24, 25) in terms of (Fe, Ti, A) in at % in an Fe—Ti-A ternary alloy phase diagram.

\* \* \* \* \*